US009739898B2

(12) United States Patent
Hoenk et al.

(10) Patent No.: US 9,739,898 B2
(45) Date of Patent: Aug. 22, 2017

(54) SUBNANOSECOND SCINTILLATION DETECTOR

(71) Applicant: CALIFORNIA INSTITUTE OF TECHNOLOGY, Pasadena, CA (US)

(72) Inventors: Michael Hoenk, Valencia, CA (US); John Hennessy, Los Angeles, CA (US); David Hitlin, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 14/670,365

(22) Filed: Mar. 26, 2015

(65) Prior Publication Data
US 2015/0276947 A1 Oct. 1, 2015

Related U.S. Application Data

(60) Provisional application No. 61/970,779, filed on Mar. 26, 2014.

(51) Int. Cl.
G01T 1/164 (2006.01)
G01T 1/24 (2006.01)
(Continued)

(52) U.S. Cl.
CPC ............ *G01T 1/249* (2013.01); *G01T 1/2018* (2013.01); *G01T 1/247* (2013.01); *G01T 1/248* (2013.01);
(Continued)

(58) Field of Classification Search
CPC .................................................... G01T 1/249
See application file for complete search history.

(56) References Cited

U.S. PATENT DOCUMENTS 4,158,133 A * 6/1979 Spaeth .............. H01L 31/02165
136/257
5,773,829 A 6/1998 Iwanczyk et al.
(Continued)

FOREIGN PATENT DOCUMENTS

WO 2013111844 8/2013

OTHER PUBLICATIONS

Hennessy, J., et al., "Metal-dielectric filters for solar-blind silicon ultraviolet detectors", Applied Optics, Apr. 10, 2015, pp. 3507-3512, vol. 54, No. 12.
(Continued)

*Primary Examiner* — David Porta
*Assistant Examiner* — Edwin Gunberg
(74) *Attorney, Agent, or Firm* — Gates & Cooper LLP

(57) ABSTRACT

A scintillation detector, including a scintillator that emits scintillation; a semiconductor photodetector having a surface area for receiving the scintillation, wherein the surface area has a passivation layer configured to provide a peak quantum efficiency greater than 40% for a first component of the scintillation, and the semiconductor photodetector has built in gain through avalanche multiplication; a coating on the surface area, wherein the coating acts as a bandpass filter that transmits light within a range of wavelengths corresponding to the first component of the scintillation and suppresses transmission of light with wavelengths outside said range of wavelengths; and wherein the surface area, the passivation layer, and the coating are controlled to increase the temporal resolution of the semiconductor photodetector.

18 Claims, 23 Drawing Sheets

(51) Int. Cl.
*G01T 1/20* (2006.01)
*H01L 27/146* (2006.01)

(52) U.S. Cl.
CPC .. *H01L 27/14663* (2013.01); *H01L 27/14685* (2013.01)

(56) References Cited

U.S. PATENT DOCUMENTS

| | | | | |
|---|---|---|---|---|
| 6,350,998 | B1* | 2/2002 | Tsuji | H01L 31/03046 257/185 |
| 6,429,414 | B1* | 8/2002 | Spahn | G01T 1/2018 250/208.1 |
| 7,129,494 | B2* | 10/2006 | Shah | C09K 11/7772 250/363.03 |
| 7,138,633 | B1* | 11/2006 | Rozsa | G01T 1/1648 250/361 R |
| 8,395,243 | B2 | 3/2013 | Hoenk et al. | |
| 8,680,637 | B2 | 3/2014 | Hoenk et al. | |
| 8,828,852 | B2 | 9/2014 | Hoenk et al. | |
| 2004/0159793 | A1 | 8/2004 | Brabec et al. | |
| 2009/0261259 | A1 | 10/2009 | Yip | |
| 2011/0079728 | A1 | 4/2011 | Garcia et al. | |
| 2013/0181312 | A1* | 7/2013 | Hoenk | H01L 31/0216 257/432 |

OTHER PUBLICATIONS

Bates, B., et al., Interference Filters for the Far Ultraviolet (1700 A to 2400 A), Applied Optics, Jun. 1966, pp. 971-975, vol. 5, No. 6.
Baumeister, P.W., et al., "Bandpass Filters for the Ultraviolet", Applied Optics, Aug. 1965, pp. 911-914, vol. 4, No. 8.
Jaksic, Z., et al., "Silver-silica transparent metal structures as bandpass filters for the ultraviolet range", Journal of Optics A: Pure and Applied Optics, 2005, pp. 51-55, vol. 7.
Beringer, J., et al., (Particle Data Group), Phys. Rev. D., 86, 345 (2012).
Hitlin, D., "Calorimetry Requirements for Next Generation Intensity Frontier Experiments" Instrumentation Frontier Community Planning Meeting, Argonne, Jan. 10, 2013.
Hamamatsu brochure for MPPC Modules, Selection guide—Jan. 2014.
Hoenk, M.E., et al., "Superlattice-doped imaging detectors: progress and prospects," Proc. SPIE. 9154, High Energy, Optical, and Infrared Detectors for Astronomy VI, 915413. (Jul. 30, 2014) Montreal, Canada, Jun. 24, 2014.
Ackermann,U., et al., "Time- and energy-resolution measurements of BaF2, BC-418, LYSO and CeBr3 scintillators" s, Nuclear Instruments and Methods in Physics Research A 786 (2015) 5-11.
Bloser, Dr. Peter F., et al., "Advanced Scintillators and Readout Devices for High-Energy Astronomy", Technology Development White Paper Submission to Astro2010: The Astronomy and Astrophysics Decadal Survey, Submitted to Program Prioritization Panel EOS (Electromagnetic Observations form Space) Mar. 31, 2009, pp. 1-10.
Bloser, Peter F.,et al., "Scintillator Gamma-Ray Detectors with Silicon Photomultiplier Readouts for High-Energy Astronomy", University of New Hampshire Scholar's Repository, Space Science Center, Institute for the Study of Earch, Oceans, and Space (EOS), Sep. 26, 2013.
Dubov, L.Yu, et al., "Optimization of BaF2 positron-lifetime spectrometer geometry based on the Geant4 simulations", Nuclear Instruments and Methods in Physics Research B 334 (2014) pp. 81-87.
Notification Concerning Transmittal of International Preliminary Report on Patentability dated Oct. 6, 2016 with International Search Report (PCT Application No. PCT/US2015/022853).

\* cited by examiner

SUBNANOSECOND SCINTILLATION DETECTOR

CROSS REFERENCE TO RELATED APPLICATIONS

This application claims the benefit under 35 U.S.C. Section 119(e) of commonly-assigned U.S. Provisional Patent Application Ser. No. 61/970,779, filed on Mar. 26, 2014, by Michael Hoenk and David Hitlin, entitled "SUBNANOSECOND SCINTILLATION DETECTOR," which application is incorporated by reference herein.

STATEMENT REGARDING FEDERALLY SPONSORED RESEARCH AND DEVELOPMENT

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to a detector and method of fabricating a detector.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

The detection of ultraviolet (UV) light has applications in planetary imaging and spectroscopy, astronomy, medical imaging, high energy particle physics, and communications. One major challenge facing ultraviolet (UV) detection is visible or solar rejection, as UV photons in bands of interest are often greatly outnumbered by visible photons, effectively reducing the signal to noise ratio. Silicon sensors can be modified, through a technique invented at the Jet Propulsion Laboratory (JPL) called delta-doping, to have very high quantum efficiency in the UV, but this high efficiency is maintained throughout the visible as well. Therefore, sensing applications requiring selective UV detection often utilize wide bandgap based systems such as microchannel plates or photomultiplier tubes. An all-solid-state alternative that could provide similar UV selectivity could result in significant improvements to detector performance and complexity.

SUMMARY OF THE INVENTION

One or more embodiments of the present invention disclose one or more scintillation detectors useful for detecting energetic photons or particles, the detectors each comprising one or more scintillators that emits light (scintillation) in response to interactions with energetic photons or particles, such that at least a first component of the scintillation has a decay time less than 100 nanoseconds; one or more semiconductor photodetectors each having a surface area for receiving the scintillation, wherein the surface area has a passivation layer configured to provide a peak quantum efficiency greater than 40% for light with wavelengths corresponding to said first component of the scintillation, and the semiconductor photodetector has built in gain through avalanche multiplication, such that charge generated in the semiconductor photodetectors in response to the scintillation is amplified through impact ionization to produce an output pulse with pulse width less than 100 nanoseconds.

The scintillation detectors further comprise a coating on the surface area, wherein the coating acts as a bandpass filter that transmits light within a range of wavelengths corresponding to the first component of the scintillation and suppresses transmission of light with wavelengths outside said range of wavelengths. The surface area, the passivation layer, and the coating are controlled to increase the temporal resolution of the semiconductor photodetectors.

The first component of scintillation can have a decay time faster than 1 nanosecond, a peak intensity with the wavelength in a range of 200-260 nanometers, and can be detected with the peak Quantum Efficiency (QE) greater than 40%.

The coating can transmit the first component having a wavelength of 300 nanometers or less and the photodetectors detect the scintillation, comprising ultraviolet scintillation, with the increased temporal resolution.

The energetic particles or photons can comprise gamma radiation.

The scintillation can be emitted in response to an event and the temporal resolution can be such that the detectors can measure the time at which the event occurs with an uncertainty of at most 1 nanosecond.

The temporal resolution can be 100 picoseconds or less or 50 nanoseconds or less.

The coating can comprise transparent dielectric and reflective metal that forms a Fabry-Perot cavity and/or a photonic bandgap, the coating can suppress the transmission of light outside the range of wavelengths such that the semiconductor photodetector has a quantum efficiency of less than 1% for out-of-band light and the peak quantum efficiency of greater than 50% for the in-band light, and/or the coating can transmit the first component of scintillation with a peak transmission of at least 50%, and the coating suppresses transmission of out-of-band light with a peak transmission of less than 3%.

The coating can be solar blind.

The passivation layer can comprise a layer of silicon that is doped with a sheet density of at least $10^{14}$ cm$^{-2}$ that at least partially passivates the surface area.

The passivation layer can comprise a silicon layer with at least one delta-doped layer.

The passivation layer can comprises a silicon layer with at least two delta-doped layers.

The passivation layer can passivate a density of interface traps ($D_{it}$) greater than $10^{14}$ cm$^{-2}$/eV, where cm is centimeters and eV is electron volts.

The passivation layer can be such that there is no change in the quantum efficiency of the detector, to within 5%, after irradiation of the surface area with a billion pulses of Electromagnetic radiation having an integrated intensity greater than 2 kilojoules per centimeter square and a wavelength of 193 nanometers.

The passivation layer can be such that there is no change in the quantum efficiency of the detector, to within 1%, after the irradiation.

The one or more scintillators can comprise one or more doped or undoped Barium Fluoride ($BaF_2$) crystals.

The one or more scintillators can emit the scintillation having the first component including a peak wavelength near 220 nanometers and a second component including a peak wavelength near 300 nanometers.

The one or more scintillators can be chosen from at least one doped or undoped crystal selected from $LaBr_3$, CsI, $CeF_3$, PWO, LSO, and LYSO.

One or more embodiments of the invention further disclose a system for performing Positron Emission Tomography (PET) and including the scintillation detector, further comprising pairs of the scintillators each comprising a first scintillator and a second scintillator, the first scintillator positioned to receive a first gamma photon and emit a first scintillation in response thereto, the second scintillator positioned to receive a second gamma photon and emit a second scintillation in response thereto, the first an second gamma photons emitted as a pair from an electron-positron annihilation, and the positron emitted by a radionuclide tracer introduced into a biological cell.

In the above PET system, one of the semiconductor photodetectors can be positioned to detect the scintillation comprising the first scintillation and one of the semiconductor detectors can be positioned to detect the scintillation comprising the second scintillation.

In the above PET system, one or more computers can perform a three dimensional calculation of a location of the radionuclide tracer, wherein the first and second scintillations define a line of response and the intersections of the lines of response are used to determine the position of the radionuclide tracer with a first uncertainty, the relative detection times of the first scintillation and the second scintillation are used to determine the position of the radionuclide tracer in an additional dimension with a second uncertainty determined by the temporal resolution of the detector, and the second uncertainty is comparable to the first uncertainty such that the computer has increased ability to reject erroneous lines of response due to background scintillation, the background scintillation including response to pairs of gamma photons that are not emitted by the electron-positron annihilation. In such a PET system, the scan time of the PET can be reduced, and a dosing of the radionuclide tracer can be reduced.

One or more embodiments of the invention further disclose a high energy particle detecting system comprising the detectors, wherein the scintillation comprises ultraviolet Electromagnetic radiation and/or gamma Electromagnetic radiation.

Thus, one or more embodiments of the invention have developed gamma ray scintillator technology with subnanosecond temporal resolution and the capability to withstand unprecedented rates and doses of high energy gamma radiation.

One or more embodiments of the system comprise a doped $BaF_2$ scintillating crystals and UV sensitive Si avalanche photodiodes to detect the scintillation light.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

As noted above, large area solid state detectors with sensitivity around 200 nm and nanosecond rise times have potential applications in astrophysics, high energy physics, and medical imaging. Next generation high energy physics experiments require detectors of high energy gamma rays that can withstand unprecedented rates and radiation doses. Current experiments employ crystals such as $PbWO_4$ or LYSO, which have scintillation decay times of ~30 ns, which is far too slow for the new high rate experiments being studied. There is a faster crystal, $BaF_2$, with a scintillation component of 0.9 ns at 220 nm that would be a good match to this task. The fast component is, however, accompanied by a larger (85% of the light) slow component (650 ns at 330 nm). Research is underway by one of the inventors to find crystal dopants, such as lanthanum, that can suppress the slow component of $BaF_2$ emission by a factor of five.

Such a scintillation crystal can be coupled to a filter and an avalanche photodetector to fabricate an ultrafast scintillation detector. The filter suppresses the slow component and allows the fast component of the scintillation to be detected by the avalanche photodetector.

Fabrication of an Avalanche Photodetector Useful for Detecting Scintillation

Figure 1:
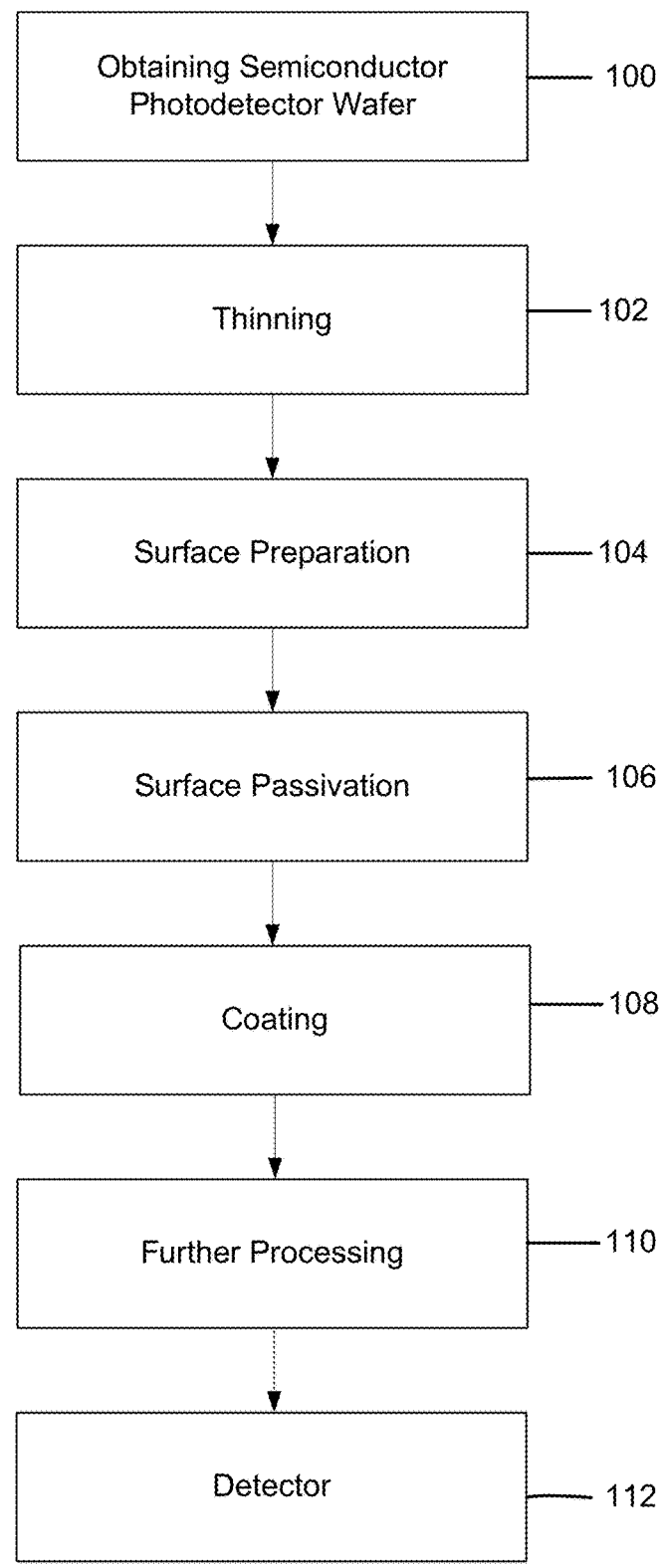
FIG. 1 illustrates a method of fabricating a detector for electromagnetic (EM) radiation, according to one or more embodiments of the invention.

FIG. 1 illustrates a method of fabricating a detector useful for detecting scintillation in response to energetic photons or particles (e.g., gamma radiation). The method can comprise the following steps.

Block 100 represents obtaining a semiconductor (e.g., silicon) photodetector wafer that can have built in gain through avalanche multiplication or avalanche gain (e.g., up to 1000 times gain) such that charge generated in the semiconductor photodetector in response to the scintillation is amplified through impact ionization.

The semiconductor photodetector can comprise an avalanche photodiode, e.g., operated in a proportional mode. Examples include a multi pixel photon counter module manufactured by Hamamatsu Photonics K. K., the Hamamatsu avalanche photodiode (APD) S8664-1010 [1], or avalanche photodiodes manufactured by Radiation Monitoring Devices Inc.

Block 102 represents thinning the photodetector to optimize the depth of the pn junction (e.g., removing 100 micrometers from the p-doped side of the detector).

Block 104 represents surface preparation of the thinned surface (e.g., cleaning the surface to be thinned using solutions of bases, acids and oxidizers to remove organic and metallic contamination).

Block 106 represents at least partially passivating the thinned surface area of the semiconductor photodetector, e.g., using surface doping methods to provide a peak quantum efficiency greater than 40% for light with wavelengths corresponding for a first component of scintillation. The passivation (and thinning and preparation in Blocks 102-104) can use the method and conditions described in [2] (see, for example col. 16 line 63-col. 7 line 52 of [2]).

The passivation layer can comprise a layer of semiconductor (e.g., silicon) that is doped with a sheet density of at least $10^{14}$ $cm^{-2}$ that at least partially passivates the surface area and is deposited on the thinned side of the photodetector. The passivation layer can comprise a silicon layer with at least one delta-doped layer or at least two delta-doped layers, or at least 4 delta doped layers. Multiple delta doped layers can be used. The inventors obtained data for devices for with 2 and 4 doped layers. The passivation layer can be deposited by Molecular Beam Epitaxy (MBE), for example.

The passivation layer can passivate a density of interface traps ($D_{it}$) greater than $10^{14}$ $cm^{-2}$ $eV^{-1}$. In one or more embodiments, the photodetector and passivation layer can consist of doped silicon.

Block 108 represents applying a coating (e.g., solar or visible blind) on the passivated surface area, wherein the coating acts as a bandpass filter that transmits light within a range of wavelengths corresponding to a first component of the scintillation and suppresses transmission of light with wavelengths outside that range of wavelengths.

The coating can comprise transparent dielectric (e.g., sapphire, $Al_2O_3$) and reflective metal (e.g., Aluminum Al) that forms a Fabry-Perot cavity and/or a photonic bandgap (e.g., a one-dimensional photonic bandgap). The coating can comprise metal (e.g., Al) embedded in dielectric (e.g., $Al_2O_3$) The coating can suppress the transmission of light outside the bandpass such that the semiconductor photodetector has a quantum efficiency of less than 1% for out-of-band light and a peak quantum efficiency of greater than 40% for the in-band light. The coating can transmit the first component of scintillation with a peak transmission of at least 40% and suppress transmission of out-of-band light with a peak transmission of less than 3%.

The coating can be deposited by Atomic Layer Deposition (ALD), e.g. using the process described in [3]. In one or more embodiments, the ALD deposition conditions can include using trimethylaluminum and oxygen plasma (or water vapor) at a substrate temperature of 200° C. for the $Al_2O_3$, and depositing the Al layer by electron beam evaporation and the thickness monitored by quartz crystal microbalance. $Al_2O_3$ layer thicknesses can be calibrated by previous depositions of single layer thin films on silicon as measured by spectroscopic ellipsometry, for example.

ALD can achieve layer by layer growth of the coating with Angstrom level/resolution control over arbitrarily large surface areas. A wide suite of materials can be deposited, such as metals, oxides, and nitrides, with excellent film properties, and the ALD layers can be directly integrated into existing detectors to vastly improve performance. The ALD enables precise, repeatable targeting of desired frequency bands, e.g., using different thicknesses.

Block 110 represents further processing of the detector and providing electronics or circuitry for processing the detected signal.

Figure 2:
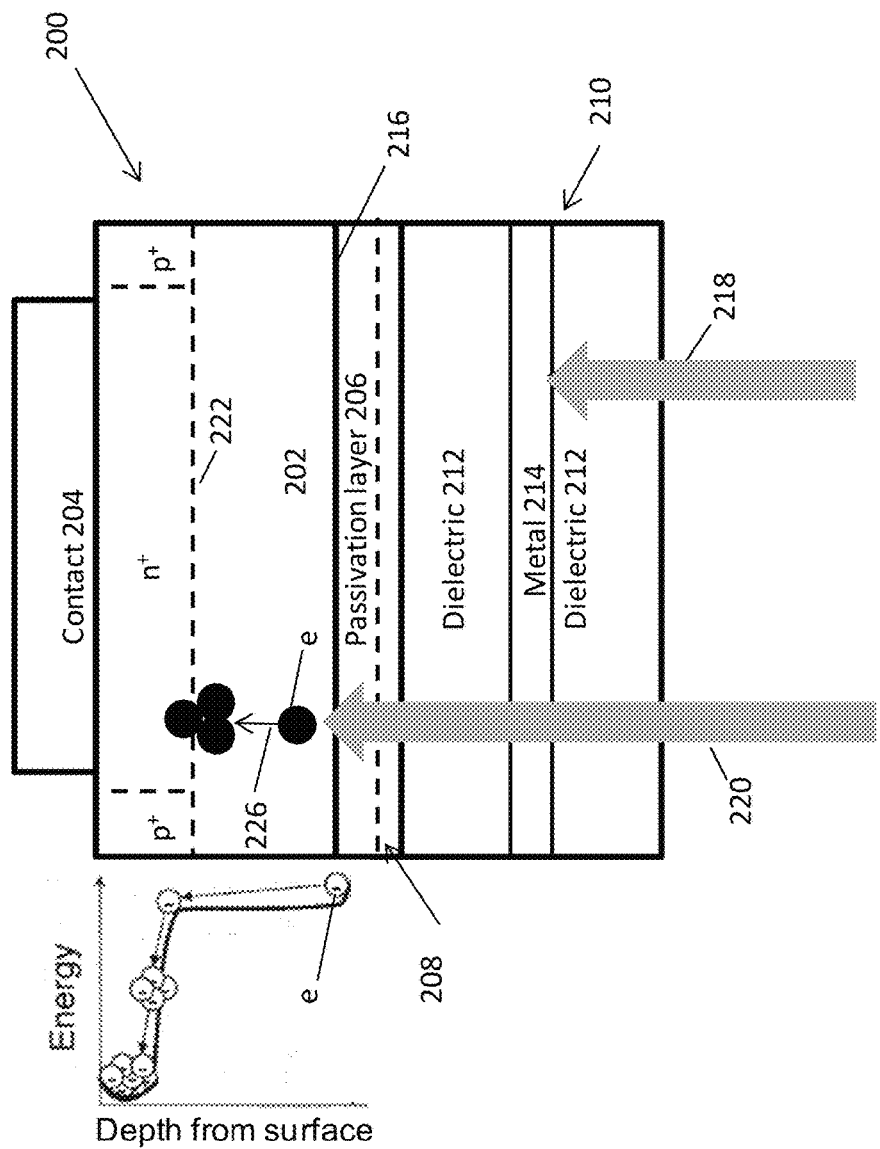
FIG. 2 is a cross-sectional schematic of a detector according to one or more embodiments of the invention.

Block 112 represents the end result, a detector useful for detecting scintillation emitted by a scintillator. FIG. 2 illustrates the detector 200 can comprise the semiconductor photodetector comprising a photosensitive $p^+$ type silicon epilayer 202 having a thickness of ~5 μm, $p^+$ regions and an $n^+$ region, and n contact 204. The detector further comprises passivation layer 206 comprising one or more doped layers 208, and coating 210 comprising dielectric layer 212 and metal 214. The passivation layer 206 is deposited on a thinned surface 216 of the semiconductor photodetector exposed by thinning the substrate of the photodetector.

In one or more embodiments, the passivation layer is typically less than 5 nm thick, while the dielectric layers can be several 10's of nm thick. The dielectric layer could in some implementations comprise multiple layers, or in others it might have a non-homogeneous or graded composition. In some implementations, there might not be a native oxide, although a native oxide between the passivation layer and dielectric 212 is possible (note that a native oxide is an oxide that forms from exposure to air, as opposed to an oxide that is intentionally grown or deposited as part of the structure). In the embodiment shown in FIG. 2, a "3 layer" filter is shown, comprising one metal layer embedded between two dielectric layers. Other designs are possible, including the "5 layer" design (see e.g., FIG. 8).

FIG. 2 further illustrates the unwanted out of band component of the scintillation 218 (e.g., at 300 nm wavelength) is suppressed by the coating and the first component of the scintillation 220 (e.g., at 220 nm wavelength) is absorbed in the p-type silicon epilayer 202 to photogenerate electrons $e^-$. The electrons $e^-$ can be transported to the pn junction 222 by diffusion or drift (e.g., with a drift velocity of 10 micrometers per picosecond). A reverse bias applied to the contact 204 with respect to the p-type back side 216 (contacted through the passivation layer) reverse biases (e.g., up to 2000V) the pn junction 222 and creates an electric field 226 that drives the photogenerated electrons $e^-$ towards the pn junction at higher speed (e.g., electron transport by electric-field induced drift rather than minority carrier diffusion). When the detector is biased, the electrons $e^-$ generate further electrons $e^-$ via impact ionization, thereby causing avalanche gain (multiplication) in the pn junction 222. This is further illustrated by the band energy diagram as a function of distance through the structure. The detected signal can be read out as is done typically for such devices (see e.g., [1]).

The surface area (e.g. at least 1 millimeter (mm) by 1 millimeter, or at least 9 mm by 9 mm), the passivation layer (e.g., comprising one or more delta-doped layers), and the coating (e.g., band pass filter) are controlled to increase the temporal resolution of the detector. For example, the surface area can control the capacitance of the detector and therefore speed of response. For example, the passivation layer (e.g, one or more delta-doped layer) can be configured to increase the speed of response by enabling the p-type layer 202 to be fully (or nearly fully) depleted. For example, the coating can transmit the first component of the scintillation having a wavelength of 300 nanometers or less such that the semiconductor photodetector detects the scintillation, comprising ultraviolet scintillation, with the increased temporal resolution (e.g. 100 nanoseconds or less, 50 nanoseconds or less, or 100 picoseconds or less. The first component of scintillation can have a decay time faster than 1 nanosecond, have a peak intensity with the wavelength in a range of 200-260 nanometers, and can be detected by the semiconductor photodetector with a peak Quantum Efficiency (QE) greater than 40%, greater than 50%, or greater than 65%, for example.

The passivation layer can be configured to be insensitive to radiation-induced surface damage, for example such that there is no change in Quantum Efficiency (QE), to within 5% or within 1%, after irradiation of the surface area with a billion pulses of the Electromagnetic radiation having an integrated intensity of greater than 2 kilojoules per centimeter square and a wavelength of 193 nanometers (see [4]).

A plurality of the detectors can be fabricated in an array, wherein each detector can comprise a pixel or detector element each having its own passivation and coating.

Fabrication of Silicon Detector Useful for Detecting Scintillation

Figure 3:
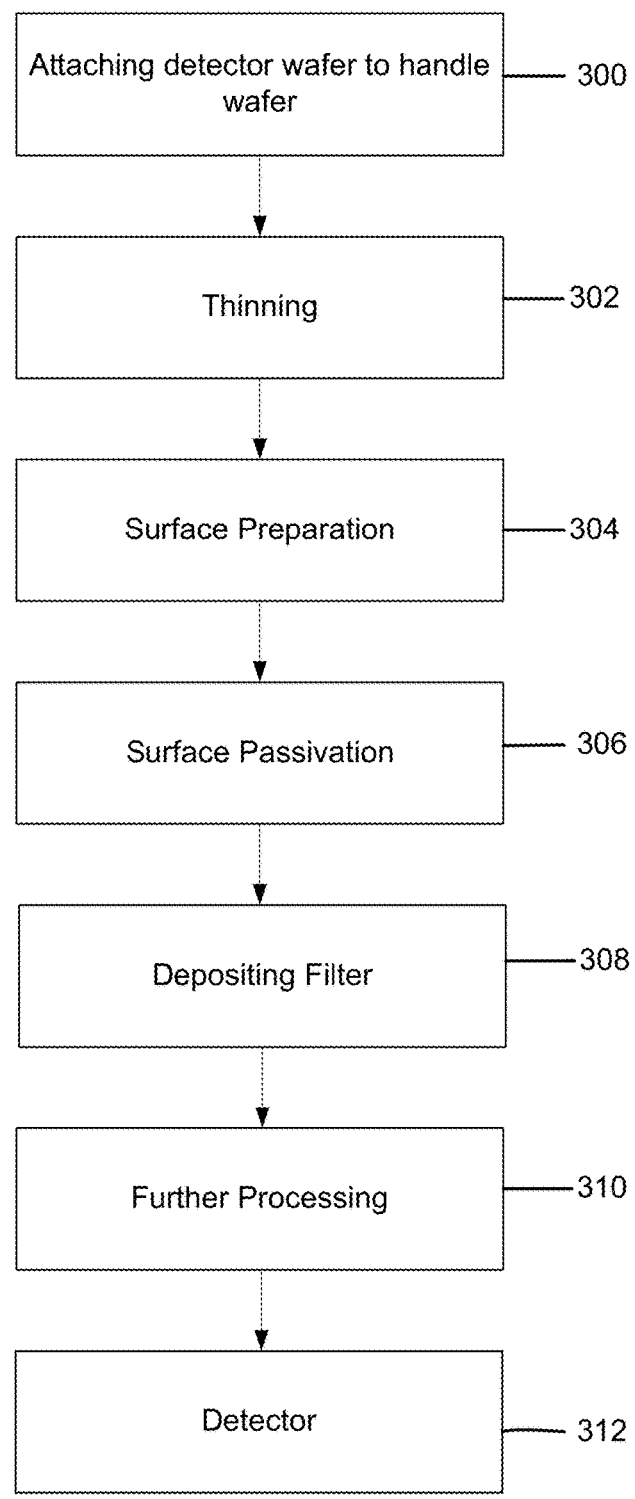
FIG. 3 illustrates a method of fabricating a silicon detector for electromagnetic (EM) radiation, according to one or more embodiments of the invention.
Figure 4:
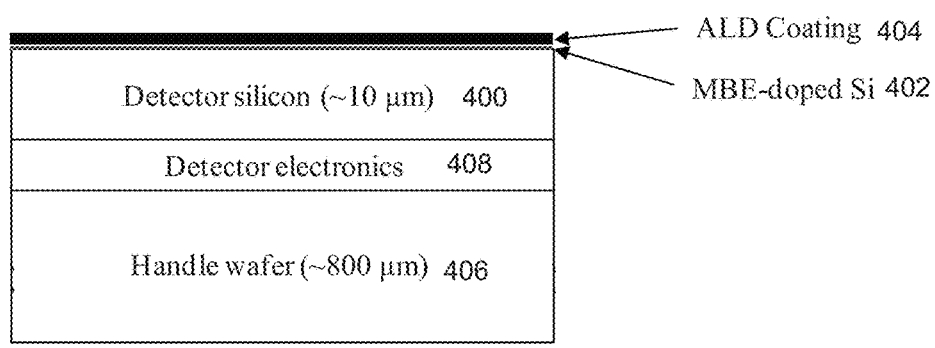
FIG. 4 illustrates a cross-sectional view of a silicon detector with passivation layer and filter coating, according to one or more embodiments of the invention.

FIG. 3 and FIG. 4 illustrate a method of fabricating a multiplicity of detectors using a wafer scale process flow.

Block 300 represents attaching a detector wafer to a handle wafer, e.g., via wafer-wafer bonding. The handle wafer can have a thickness of ~800 micrometers, for example.

Block 302 represents thinning the detector wafer (e.g., thinned to a thickness of 3-15 micrometers).

Block 304 represents surface preparation, as described in Block 104 above.

Block 304 represents passivating the thinned surface area of the detector wafer on the thinned side, as described in Block 106 above.

Block 306 represents depositing a filter or coating on the thinned and passivated surface, as describe in Block 108 above.

Block 310 represents further processing, comprising patterning, etching, dicing, and packaging to form a detector chip.

Block 312 represents the end result, a detector. FIG. 4 illustrates an example comprising detector silicon 400 (e.g., 10 micrometers thick) with passivation layer 402 (e.g., MBE delta doped Si), filter coating 404 (e.g., ALD coating), handle wafer 406, and detector electronics 408 to process the signal detected by the detector.

In one or more embodiments, the semiconductor photodetector can comprise a standard detector (e.g., standard APD) that is modified to provide higher sensitivity, higher speed and time resolution using the bandpass filter and passivation.

Passivation Techniques

Surfaces and interfaces in semiconductors are the source of a variety of problems in semiconductor devices. Surface/interface states can act as electronic or amphoteric traps and centers of recombination and generation that can have multiple deleterious effects on device performance, including dark current, noise, and instabilities in semiconductor devices, and thus present a long-standing problem in semiconductor device technology. Passivation of surfaces and interfaces mitigates these problems [5].

In state-of-the-art devices, surface passivation is addressed by two strategies that can be used alone or in combination. In the first approach, defects or interface states at surfaces and interfaces are eliminated, neutralized, or otherwise electrically deactivated or reduced through chemical means or passivation and/or growth/deposition of a low-defect surface. Examples of this strategy include the formation of high quality $SiO_2$ layers on a silicon surface in order to minimize the surface defect density, and the chemical passivation of defects with atomic hydrogen by, for example, annealing in forming gas or ion implantation and thermal activation.

Second, chemisorption and/or surface doping methods can be used to control the surface potential, e.g., to create an electric field near the semiconductor surface in order to bias the surface into accumulation and prevent minority carriers from interacting with surface defects.

For example, growth of one or more delta-doped layers on the semiconductor of the photodiode can passivate the photodiode surface in which the Si—$SiO_2$ interface has a high density of electrically-active surface defects. Electronic states associated with defects in the Si—$SiO_2$ interface can acquire a positive charge as a result of trapping of holes, and the resulting deficit of holes in the one or more delta-doped layers creates a negatively charged layer near the Si—SiO$_2$ interface. This separation of charge creates a near surface electric field of the right polarity to drive photogenerated electrons away from the interface and toward the pn junctions for detection. A highly defective or damaged Si—SiO$_2$ interface can acquire a positive charge density in excess of ~$10^{14}$ cm$^{-2}$. A delta doped surface provides even higher two dimensional dopant density, $n_{2D}$, of $2 \times 10^{14}$ cm$^{-2}$, and a superlattice comprising multiple delta-doped layers can achieve a two dimensional dopant density of ~$10^{15}$ cm$^{-2}$. For comparison, the density of silicon atoms on a (100) surface have $n_{2D}$ of ~$6.8 \times 10^{14}$ cm$^{-2}$.

Figure 5:
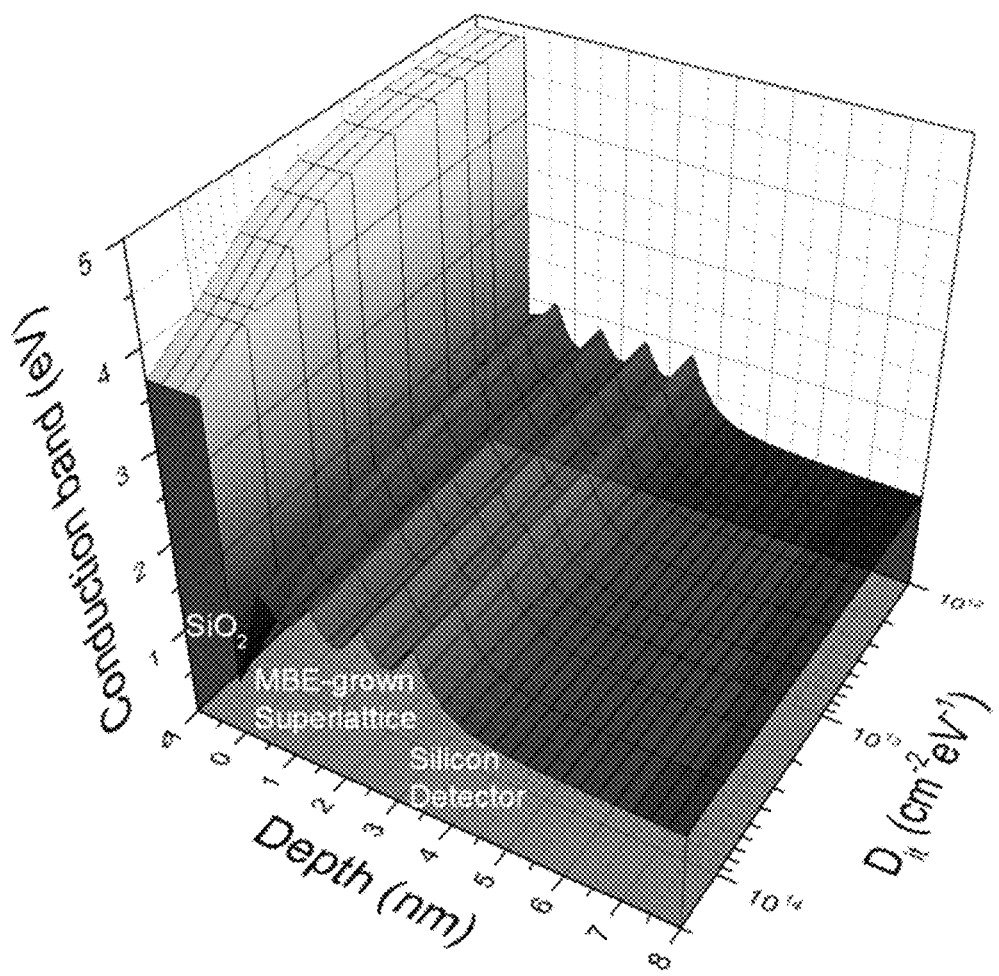
FIG. 5 shows conduction band energy in eV vs. density of interface traps $D_{it}$ and depth, using a superlattice with four delta-doped layers having a combined surface doping density of $8 \times 10^{14}$ $cm^{-2}$ and a total thickness of less than 5 nm that can be used in the passivation layer of the detector of one or more embodiments of the invention.

FIG. 5 shows a superlattice (with four delta-doped layers having a combined surface doping density of $8 \times 10^{14}$ cm$^{-2}$ and a total thickness of less than 5 nm) can passivate a silicon surface with interface trap density ($D_{it}$) of at least $10^{14}$ cm$^{-2}$ eV$^{-1}$.

In a high quality silicon surface with low density of electrically-active defects, atomic hydrogen plays a critical role in surface passivation by bonding to and thereby passivating surface defects. In a typical silicon surface, the Si—SiO$_2$ interface contains a density of atomic hydrogen with $n_{2D}$ of ~$1$-$2 \times 10^{14}$ cm$^{-2}$. However, this hydrogen is weakly bound and vulnerable to radiation damage (especially UV damage) that can liberate H$^+$ ions and thereby cause the formation of traps in the oxide, damaging the oxide and leading to charge trapping at the oxide semiconductor interface. Thus, hydrogen passivation is insufficient to provide stability against a high radiation environment.

Surprisingly and unexpectedly, superlattice-doped detectors, on the other hand, are stable against a high radiation environment (see [4], describing the physics of superlattice-doped surfaces, data on the UV-stability of superlattice-doped detectors, and quantum efficiency data on the inventive technology used in one or more embodiments of the invention).

Figure 6A:
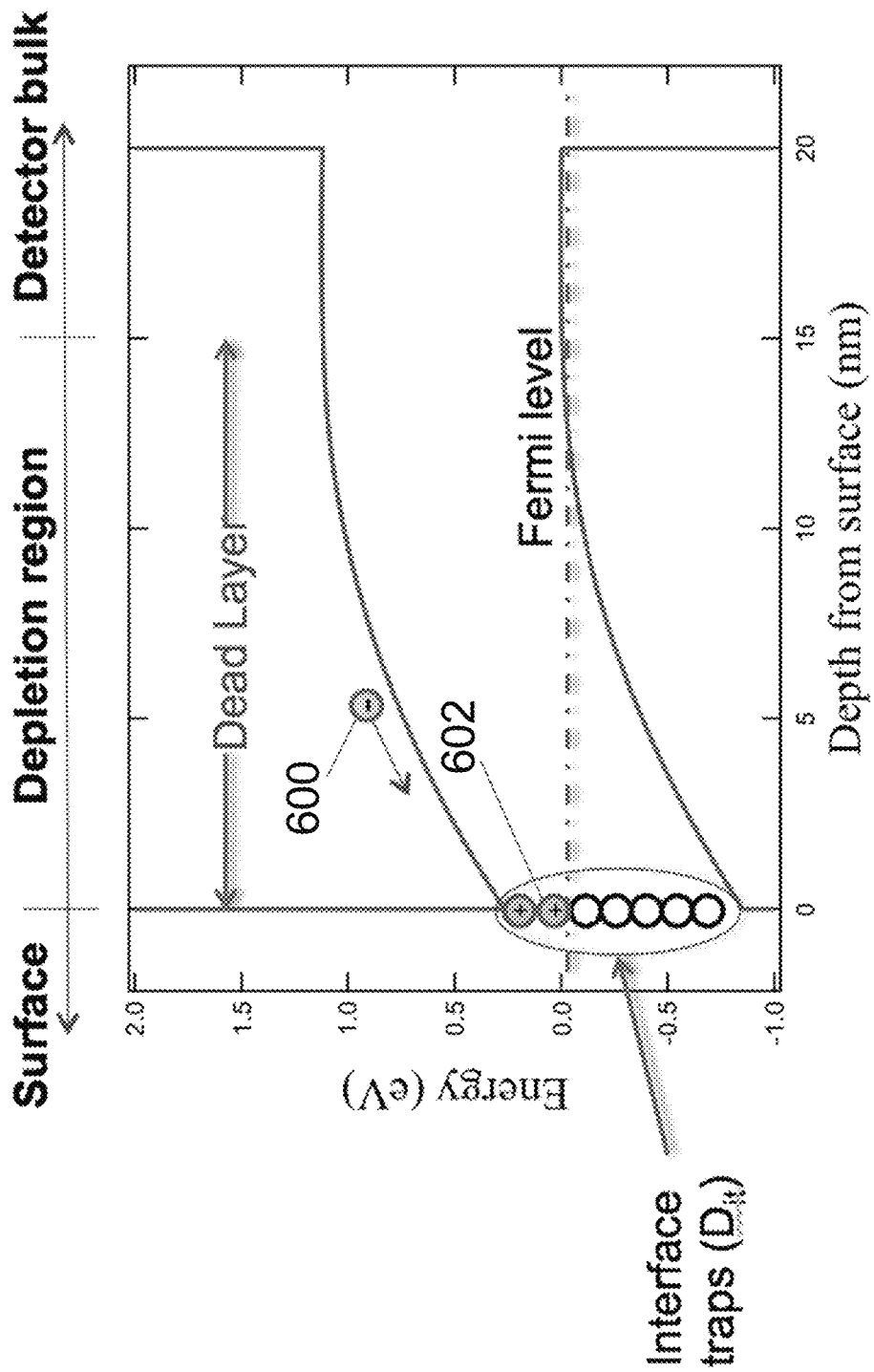
FIG. 6a illustrates the relationship between surface charging (due to interface traps) and the surface dead layer in a conventionally-doped surface (e.g., using a surface doping method such as dopant diffusion or ion implantation).
Figure 6B:
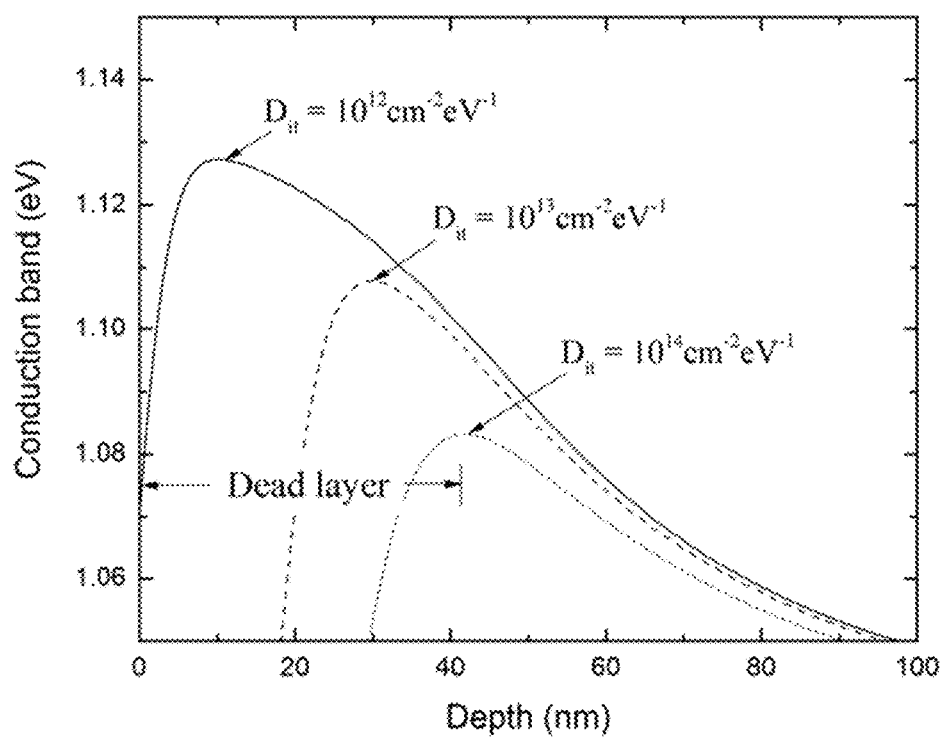
FIGS. 6b and 6c show the conduction band vs. depth from the surface for three different interface trap densities, simulating progressive UV-induced surface damage.
Figure 6C:
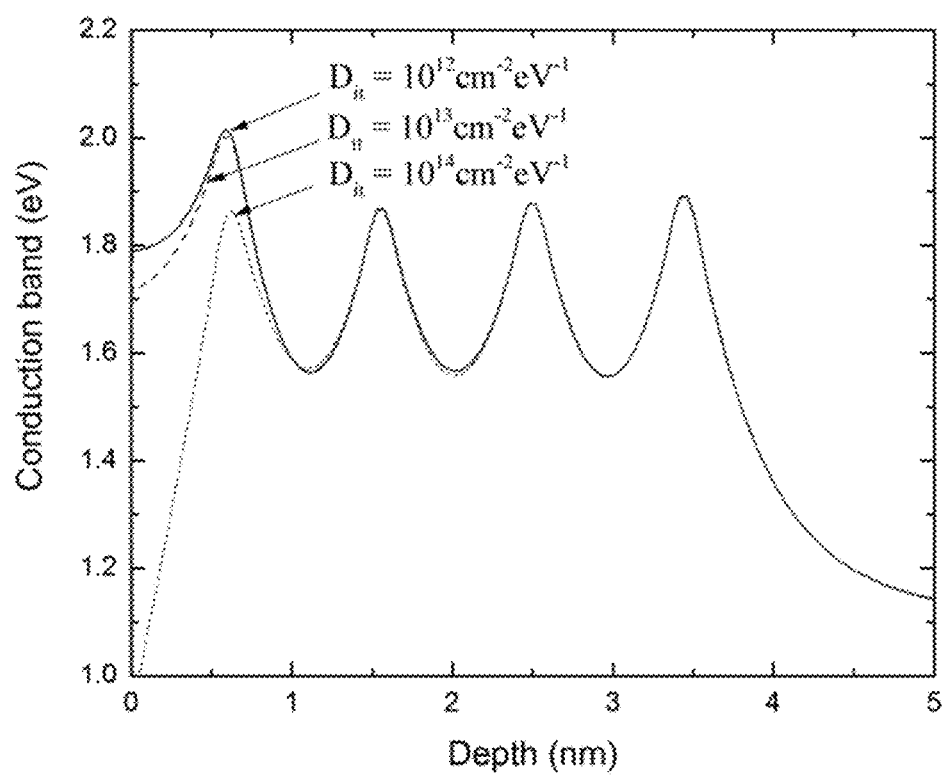

Radiation- and/or UV-induced surface damage can cause the formation of traps in the near interfacial region of the detector surface. Holes captured by these traps can create fixed positive charge at the interface, resulting in the formation of a near-surface depletion layer. This near-surface depletion layer is commonly known as a "dead layer" in conventionally-doped detectors because of the corresponding high rates of surface recombination. Moreover, this dead layer contributes to detector instabilities (e.g., Quantum Efficiency Hysteresis, or QEH), because the width of the dead layer is sensitive to time-varying interface charge density when the detector is illuminated. FIGS. 6a, 6b and 6c compare the effects of UV-induced surface damage on ion-implanted vs. superlattice-doped surfaces. FIG. 6a illustrates the relationship between surface charging (due to interface traps) and the surface dead layer in a conventionally-doped surface (e.g., using a surface doping method such as dopant diffusion or ion implantation) and shows that Quantum Efficiency Hysteresis (QEH) is observed in detectors passivated using conventional methods, because the depth of the dead layer varies under illumination. This problem becomes worse in conventionally-doped detectors (e.g., detectors passivated using dopant diffusion or ion implantation methods) as a result of radiation- and/or UV-induced surface damage. Negative charge (electrons) 600 and positive charge (holes) 602 are shown.

FIGS. 6b and 6c show the conduction band vs. depth from the surface for three different interface trap densities, simulating progressive radiation- and/or UV-induced surface damage. In FIG. 6b, simulating a UV-damaged, conventionally-doped surface, a density of interface traps ($D_{it}$) creates a surface dead layer, resulting in low and unstable quantum efficiency. In FIG. 6c, simulating a UV-damaged, superlattice-doped surface, a density of interface traps ($D_{it}$) has virtually no effect on the surface band structure, corresponding to the exceptional stability of superlattice-doped detectors. Note the difference in scale between FIGS. 6b and 6c: superlattice doping creates a near-surface energy barrier that is simultaneously thinner (higher quantum efficiency) and higher (greater stability).

Filter/Coating Structures

The filter/coating structures can be fabricated from alternating thin films of transparent dielectric layers and reflective metallic layers. Structures like this are commonly referred to as Fabry-Perot cavities or photonic bandgaps [6]. Depending on the target UV wavelength and desired filter properties, the dielectric layers may be composed of any material that is optically transparent in the intended range which may include, for example, HfO$_2$, Al$_2$O$_3$, SiO$_2$, MgF$_2$, or AlF3. Multilayer stacks of these materials (or others) may also be used to improve the index-matching of the composite dielectric layer. The metallic layer is ideally fabricated from a material with high natural reflectance in the band of interest, for UV applications at wavelengths below 300 nm the most optimal choice is pure aluminum. The final filter structure is deposited directly on the passivated surface of a silicon sensor (CCD, CMOS, photodiode, etc.) with a suitable technique that may include atomic layer deposition, chemical vapor deposition, and evaporation among others. Filter throughput, rejection ratio, bandwidth, and other performance parameters are a functions of the final design which may include multiple periods of the metal-dielectric assembly. Total throughput is ultimately limited by optical absorption losses in the metal layers which may limit the optimal number of periods that can be utilized.

Figure 7A:
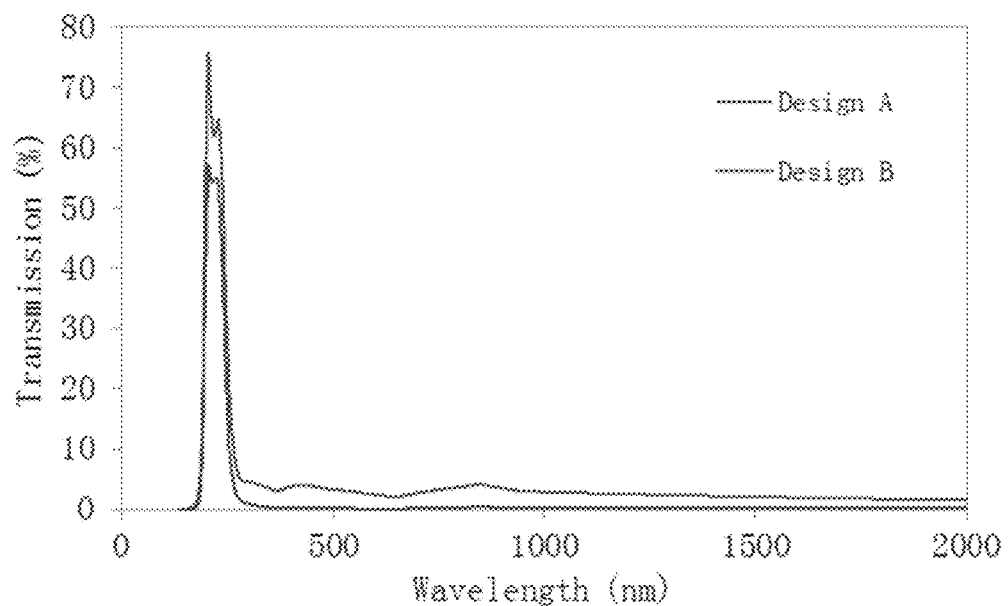
FIG. 7a-b illustrate transmission of visible blocking filters with high transmission in the 200 nm-235 nanometer wavelength range that can be used in the detector according to one or more embodiments of the invention.
Figure 7B:
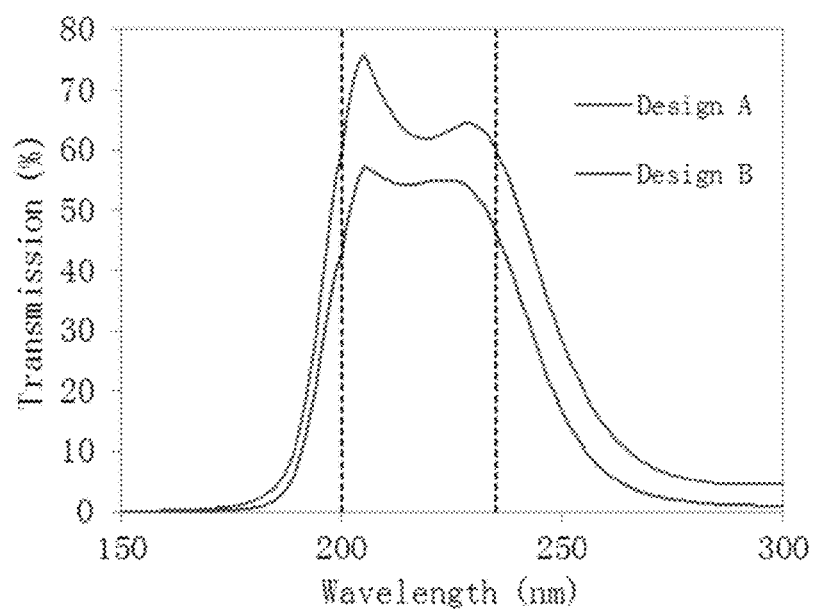

FIG. 7a-b illustrate transmission of visible blocking designs for the 200 nm-235 nanometer wavelength range. Both design A and design B comprise a 5 layer stack of metallic aluminum and Al$_2$O$_3$.

Design A: 37.8 nm thick Al$_2$O$_3$/14.6 nm thick Al/33.7 nm thick Al$_2$O$_3$/4.7 nm Al/41.3 nm thick Al$_2$O$_3$. Design A achieves an average transmission T (at wavelengths of 200 nm-235 nm)=65.4% and average T (at wavelengths of 400 nm-1000 nm) of 3.16%, corresponding to a blocking ratio of ~21:1. The average transmission in the passband can match a single layer of Al$_2$O$_3$.

Design B: 39.1 nm thick Al$_2$O$_3$/18.1 nm thick Al/33.2 nm thick Al$_2$O$_3$/15.4 nm Al/17.7 nm thick Al$_2$O$_3$. Design B achieves an average transmission T (at wavelengths of 200 nm-235 nm)=53.5% and average T (at wavelengths of 400 nm-1000 nm) of 0.23%, corresponding to a blocking ratio of ~234:1.

Giving up more passband transmission or narrowing can further improve the blocking ratio. The above models assume thin Al layers will behave optically like a bulk layer with the same refractive index n and extinction coefficient k.

These initial designs could be modified and the design space could be further explored (e.g., modifying the choice of dielectric, number of layers vs. blocking ability etc.). For example, 3 layers can obtain more than 50% QE for the desired wavelength, and 5 layers can obtain more than 40% for the desired wavelength.

The direct integration of metal-dielectric optical filters onto a back illuminated Si sensor can the preserve the high quantum efficiency of the detector within the wavelength band of interest while simultaneously providing large out-of-band rejection of longer wavelength light.

The use of metal dielectric structures as optical bandpass filters has been studied for for use in UV applications [7-9]. However, one or more embodiments of the present invention are able to provide direct integration of such structures onto a silicon sensor platform.

It can be shown that the optical admittance matching of the filter structure is improved by the silicon substrate which increases throughput, and also that the silicon substrate itself acts as additional reflector to dramatically improve the out-of-band rejection. Silicon integration offers typical performance improvements of 3-5 times compared to commercially available stand-alone metal-dielectric UV bandpass filters.

Device Performance Results

Figure 8:
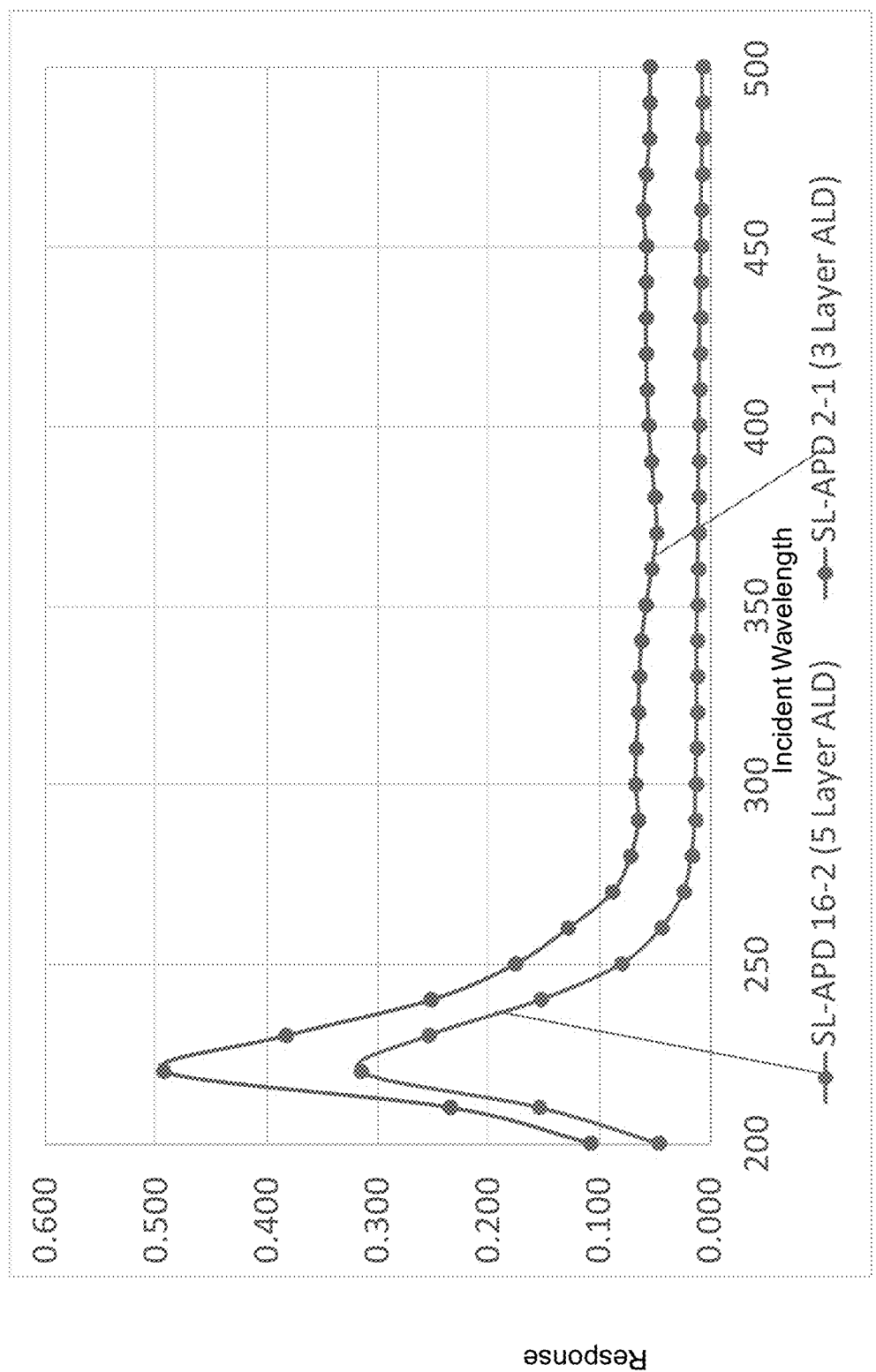
FIG. 8 shows the measured relative response of superlattice-doped APDs, with 3 and 5 layer metal-dielectric filters as a function of wavelength of incident EM radiation in nanometers, fabricated according to one or more embodiments of the invention.

FIG. 8 shows the measured relative response of superlattice-doped APDs with 3 and 5 layer metal-dielectric filters. Note that these measurements were made at low gain (low bias corresponding to unity gain), and the quantum efficiency increases when the devices are operated at high gain (high bias) due to the higher electrical fields produced in the device. This figure demonstrates the performance of two different filters on actual devices.

Figure 9:
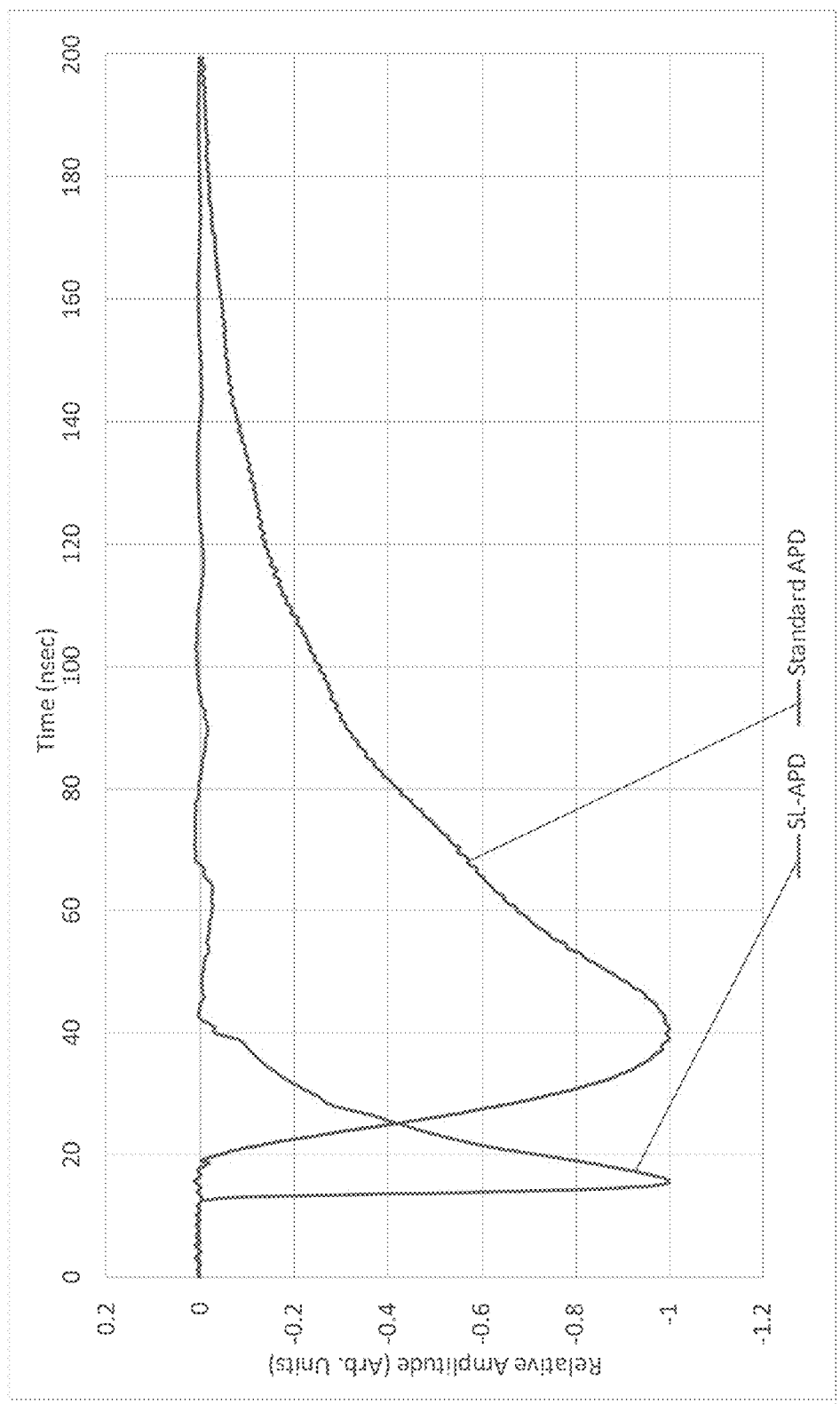
FIG. 9 is comparison of the response times (amplitude of response in arbitrary units versus time in nanoseconds) of a superlattice doped avalanche photodiode (SL-APD) and a conventional, state-of-the-art APD, showing faster response for the SL-APD fabricated according to one or more embodiments of the invention.

FIG. 9 is a comparison of the measured response times of a superlattice doped avalanche photodiode (SL-APD) with coating according to one or more embodiments (based on FIG. 2), and a conventional, state-of-the-art APD. FIG. 9 shows faster response (rise and decay times) for the inventive technology comprising the superlattice doped avalanche photodiode with coating according to one or more embodiments of the present invention.

For the data in FIGS. 8 and 9, the passivation layer comprises 4 doped layers.

Scintillation Crystals

Figure 10A:
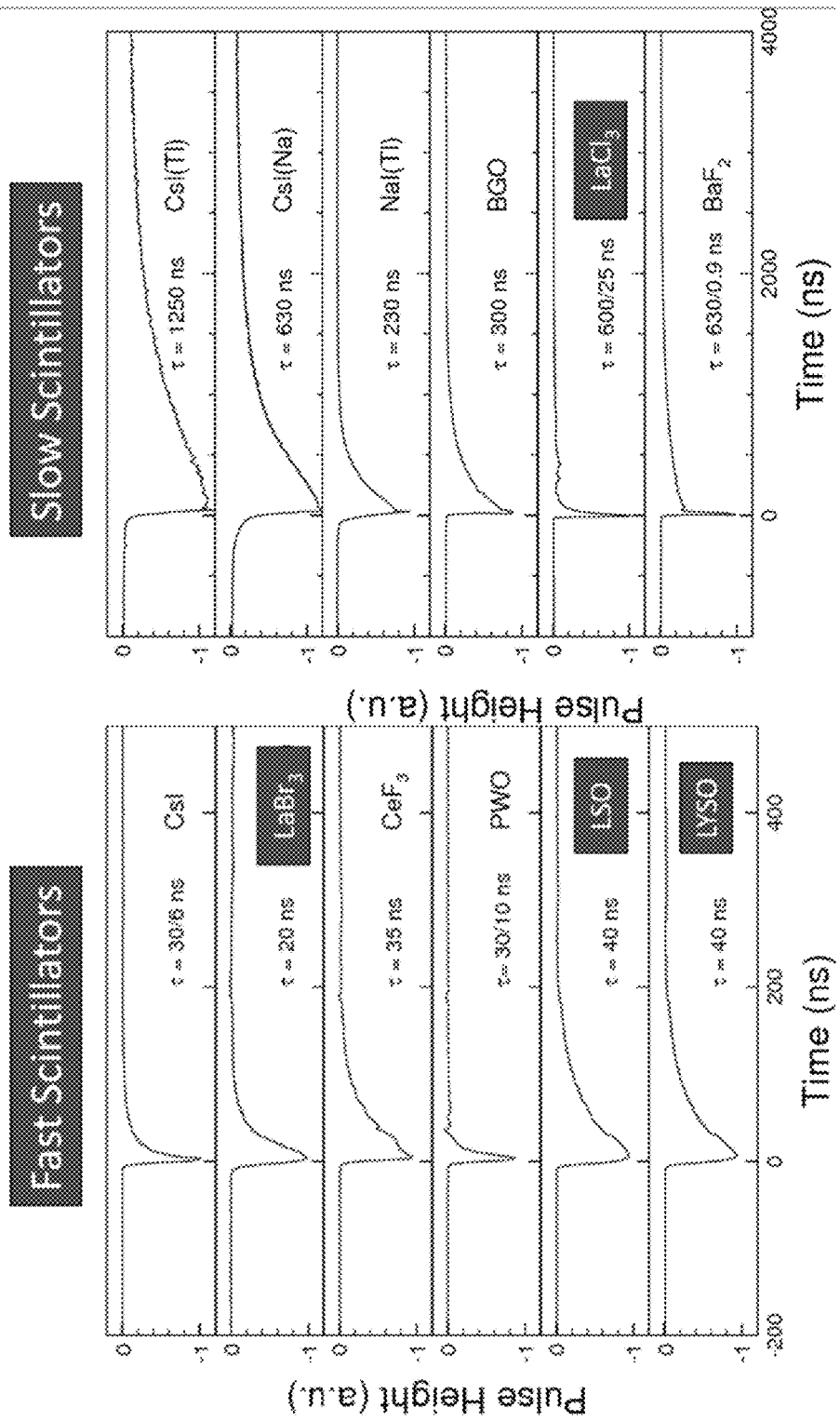
FIG. 10a illustrates scintillator pulse shapes and response times for various scintillator crystals that can be coupled to the detector according to one or more embodiments of the invention.
Figure 10B:
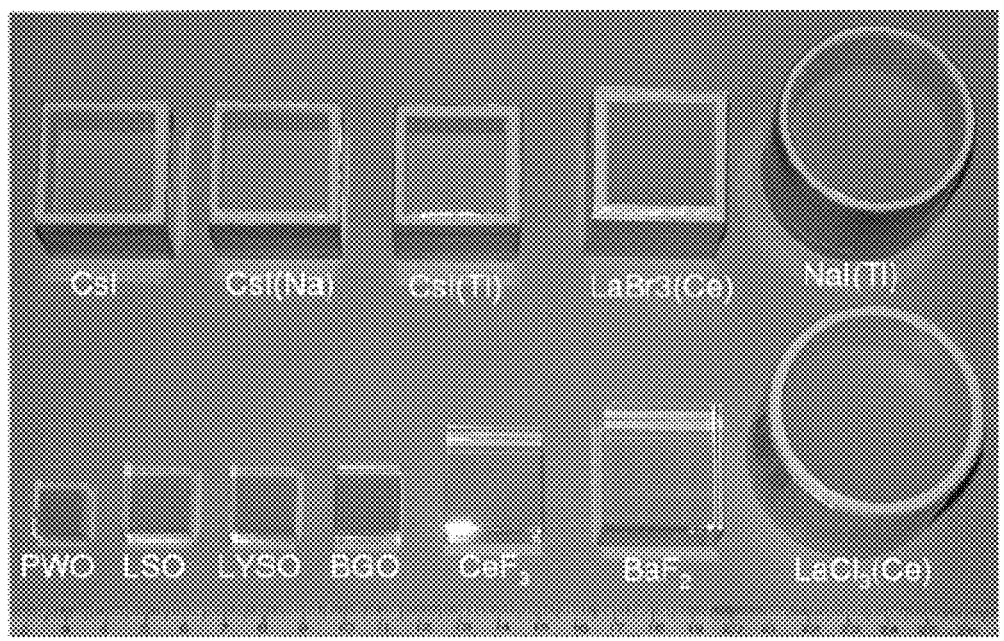
FIG. 10b illustrates various scintillator crystals that can be coupled to the detector according to one or more embodiments of the invention.

Scintillation pulse shapes are important figures of merit for the design of coatings and selection of scintillator. For a fast detector, rise and decay times matter. FIG. 10a illustrates scintillator pulse shapes for various scintillator crystals (Caesium iodide (CsI), Lanthanum (III) Bromide (LaBr$_3$), CeF$_3$, lead tungstate (PWO), Cerium-doped lutetium oxyorthosilicate (LSO), Cerium-doped Lutetium Yttrium Orthosilicate (LYSO), CsI(Ti) (CsI doped with Ti), CsI(Na) (CsI doped with Na), NaI(Tl), Bismuth germinate Bi$_4$Ge$_3$O$_{12}$ (BGO), LaCl$_3$, and Barium Fluoride (BaF$_2$)) that are illustrated in FIG. 10b. The scintillators are grouped as fast scintillators and slow scintillators. The time constant τ is the decay time constant for the pulse (where two numbers are given, the data is fit using two time constants).

Figure 11A:
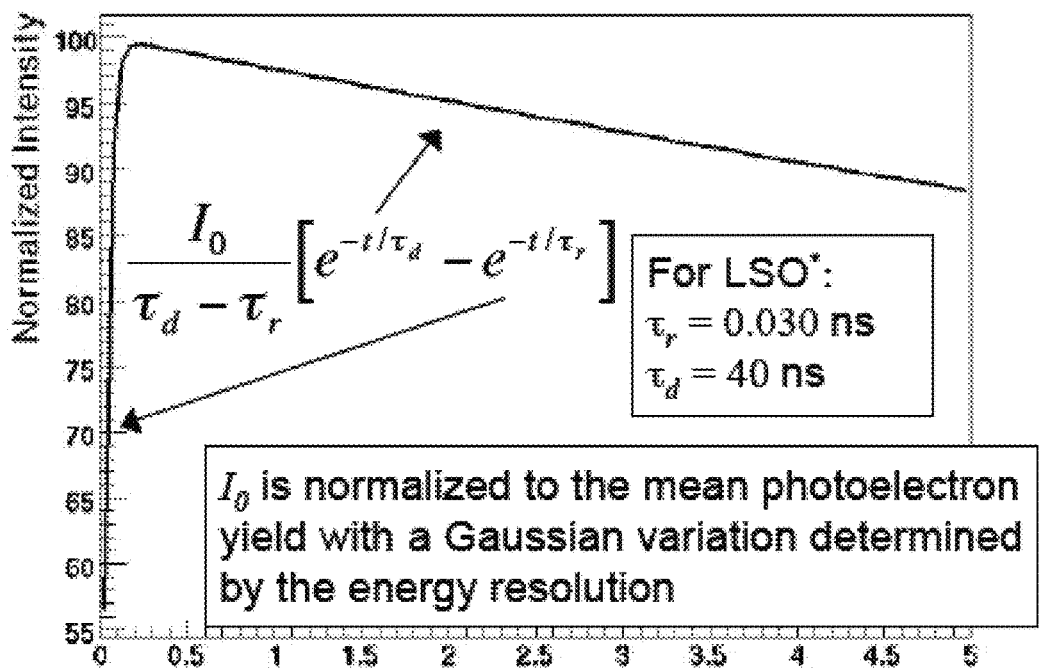
FIG. 11a-b shows how the scintillator pulse shape can be modeled.
Figure 11B:
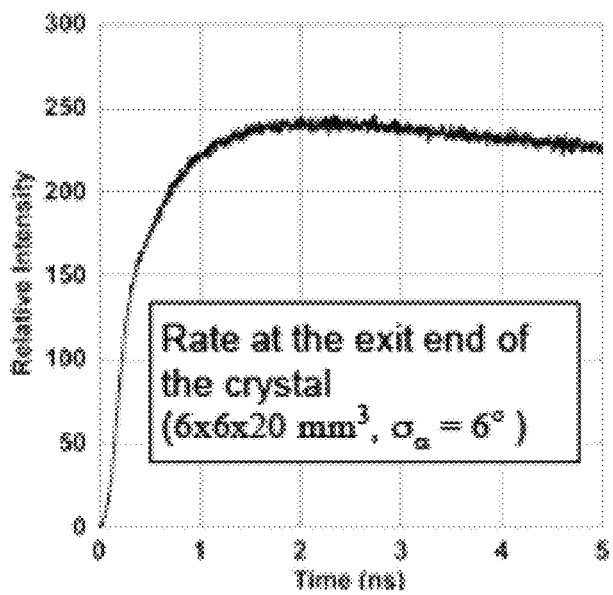

FIGS. 11a-b shows how the pulse shape can be modeled using the formula:

$$\frac{I_o}{\tau_d - \tau_r}[e^{-t/\tau_d} - e^{-t/\tau_r}]$$

where $I_o$ is normalized to the mean photoelectron yield with a Gaussian variation determined by the energy resolution (for LSO $\tau_d$=40 ns and $\tau_r$=0.030 ns). FIG. 11a shows the rate at the exit end of the crystal (6×6×20 mm$^3$ size, σ=6 degrees).

Figures of merit for various scintillator crystals can be found in [10].

Figure 12:
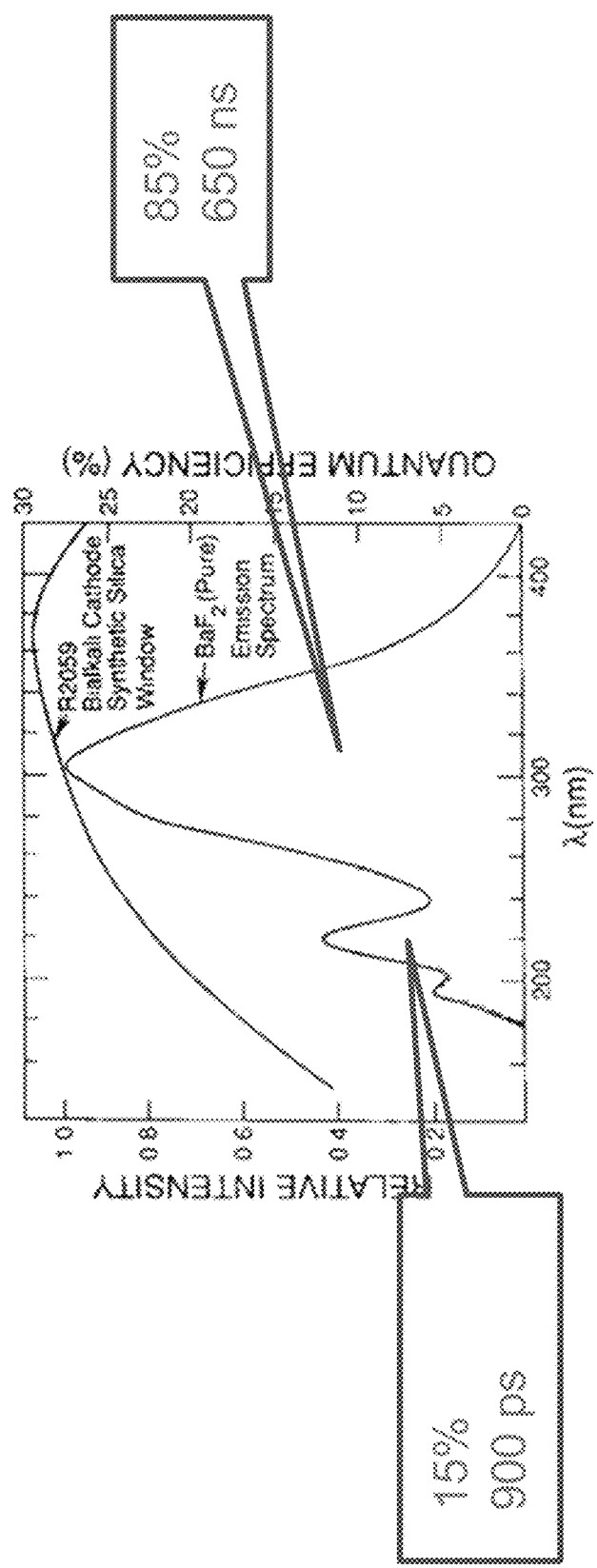
FIG. 12 illustrates the emission of the $BaF_2$ scintillating crystal that can be coupled to the detector according to one or more embodiments of the invention.

BaF$_2$ is among the fastest scintillating crystals, having a decay time constant τ=0.9 nanoseconds. However, BaF$_2$ also has a decay time constant with a much larger and slower component at 650 ns, as illustrated in FIG. 12. FIG. 12 shows the total light output of 1.2×10$^4$ photons/MeV, where 85% of the output is in the slow component at 650 ns and 15% of the output is at the fast component at 900 ps. In order to take advantage of the fast component, it is necessary to suppress the slow component (e.g., using a solar blind photosensor).

Figure 13:
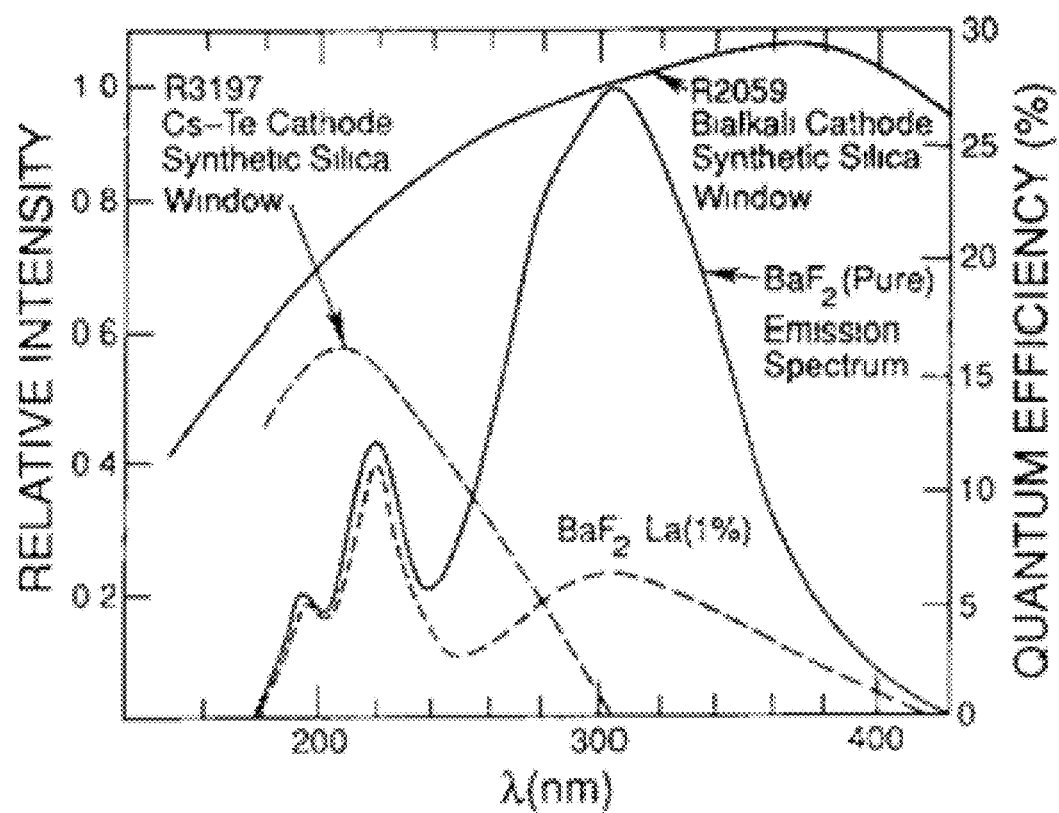
FIG. 13 shows that pure $BaF_2$ doped with La (1%) has a reduced slow component, reduced by a factor of ~4 as compared to the undoped pure $BaF_2$, showing that doped $BaF_2$ can also be used as a scintillator coupled to the detector according to one or more embodiments of the invention.

FIG. 13 shows that pure BaF$_2$ doped with La (1%) has a reduced slow component, reduced by a factor of ~4, as compared to the undoped pure BaF$_2$. Also shown is the transmission of a Cs—Te cathode silica window and a Bialkali cathode synthetic window. \

Figure 14:
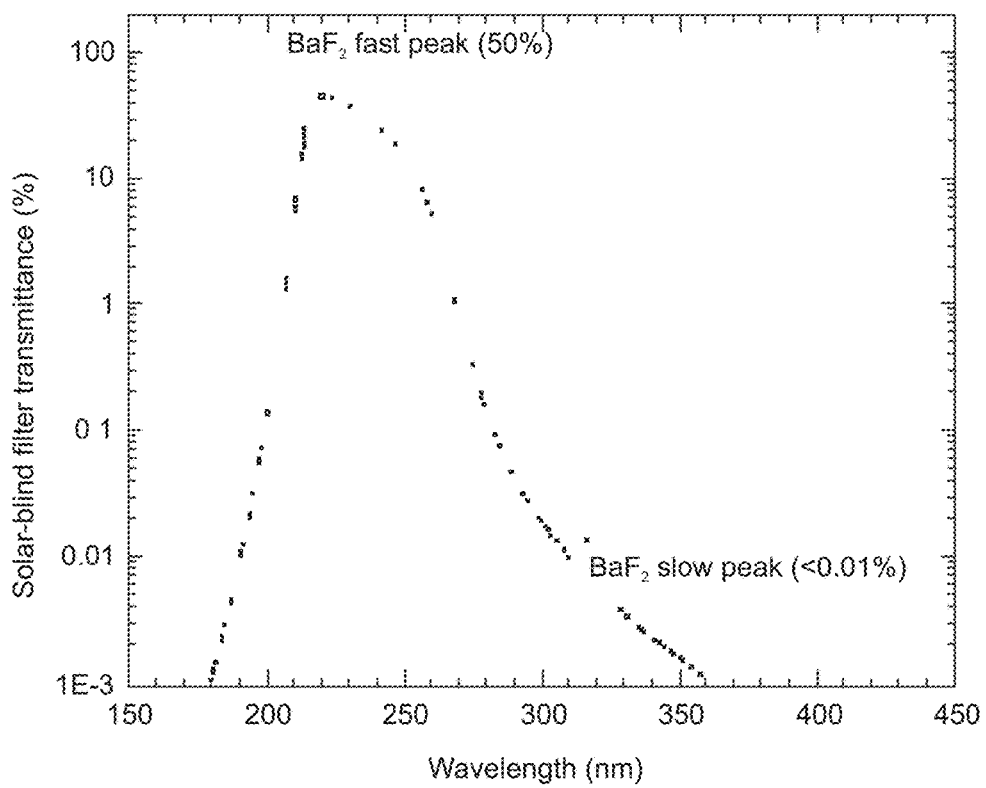
FIG. 14 shows the calculated transmittance of a solar blind, 9 layer antireflection coating optimized for the high speed $BaF_2$ scintillators, according to one or more embodiments of the invention.

FIG. 14 shows the calculated transmittance of a solar blind, 9 layer antireflection coating optimized for the high speed BaF$_2$ scintillators. This coating can be used as the coating in FIG. 2.

Figure 15:
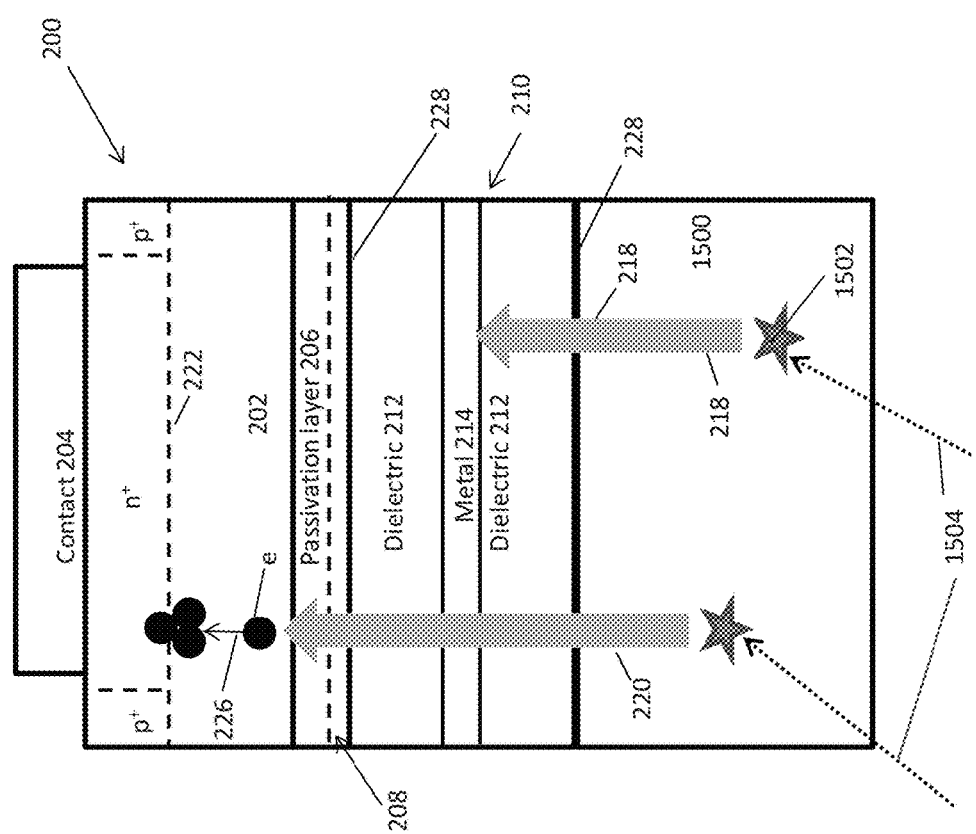
FIG. 15 illustrates a scintillator coupled to the detector of FIG. 2, according to one or more embodiments of the invention.

FIG. 15 illustrates a scintillation detector useful for detecting energetic photons or particles, comprising a scintillator 1500 that emits light (scintillation 1502) in response to interactions with energetic photons 1504 or particles, such that at least a first component of the scintillation has a decay time less than 100 nanoseconds, for example. The scintillator is positioned (e.g., coated or glued on the coating, or positioned with a gap, such as an air gap, or remote from the photodetector 200) such that the semiconductor photodetector detects EM radiation 220 comprising the scintillation 1502. In one or more embodiments, the scintillator comprises a BaF$_2$ crystal and/or emits the scintillation including a fast component with a peak wavelength of or near 220 nanometers and a slow component including a wavelength of or near 300 nanometers.

The scintillation detector further comprises one or more semiconductor photodetectors 200 each having a surface area 228 for receiving the scintillation, wherein the surface area has a passivation layer 206 configured to provide a peak quantum efficiency greater than 40% for light with wavelengths corresponding to said first component of the scintillation, and the semiconductor photodetector has built in gain through avalanche multiplication, such that charge generated in the semiconductor photodetectors in response to the scintillation is amplified through impact ionization (e.g., to produce an output pulse with pulse width less than 100 nanoseconds).

The scintillation detector further comprises a coating 210 on the surface area, wherein the coating acts as a bandpass filter that transmits light within a range of wavelengths corresponding to the first component of the scintillation 220 and suppresses transmission of light 218 with wavelengths outside said range of wavelengths.

The surface area, the passivation layer, and the coating can be controlled to increase the temporal resolution of the semiconductor photodetector.

For particle accelerator applications, the surface area 228 of the photodetector could be e.g., 9 mm by 9 mm and the scintillator could be larger, e.g., 3 cm×3 cm×3 cm to absorb the large fluxes of radiation, for example. For PET scan applications, the surface area of the photodetector could be smaller (a few mm on a side) and the scintillator can also be smaller due to the smaller radiation doses involved, for example. There can be a plurality of scintillators coupled to one photodetector (several scintillators per photodetector) or a plurality of photodetectors coupled to one scintillator (e.g., several photodetectors 200 per scintillator).

In one or more embodiments, the detector can be operated as follows. A bias voltage (i.e., a high voltage DC bias that maintains constant voltage) can be applied to the p-type contact, while the n-type contact is near ground. The detector can be wired up to measure a differential signal between the p and n side contacts. Because the amplification is applied to the current of photoelectrons going into the n-type contact, the n-side contact can be capacitively coupled to a pulse detection circuit, which would effectively screen out any DC component of the signal. In one or more embodiments where this circuit is used to measure "flashes" of light from scintillation events, the signal measured at the detector output should be either a current or voltage pulse (depending on how the circuit is designed) and the detector response can be at least as fast as the fastest component of the scintillator "flash", so that the time resolution of the detector and scintillator is as good as possible.

Examples of Applications

High Energy Physics and Nuclear Physics (e.g., Particle Detection)

A high energy particle detecting system can comprise the detector according to one or more embodiments of the invention, wherein the detector is for detecting ultraviolet EM radiation and/or gamma EM radiation.

Figure 16:
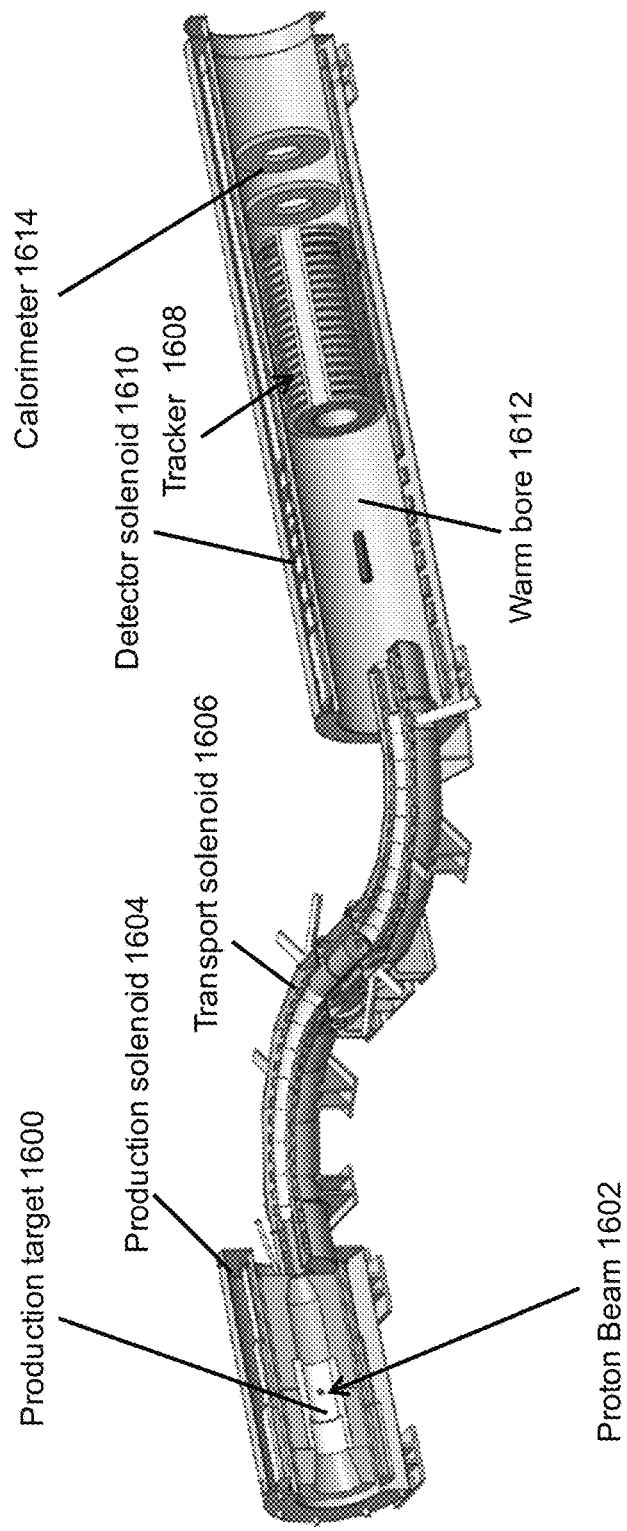
FIG. 16 illustrates a particle accelerator and collider system that can include the detector according to one or more embodiments of the invention.

FIG. 16 illustrates a particle accelerator and collider system that can include the detector of FIG. 15 (the Mu2e experiment at Fermilab, described at http://mu2e.fnal.gov/). The system comprises a production target 1600, proton beam 1602, production solenoid 1604 (providing graded field), transport solenoid 1606 (providing collimation system to select muon charge and momentum range), tracker 1608, detector solenoid 1610, muon stopping target, warm bore 1612 evacuated to $10^{-4}$ Torr, and calorimeter 1614, wherein the calorimeter 1616 comprises the detector according to one or more embodiments of the invention. The system can deliver ~0.0016 stopped muon ($\mu^-$) per incident proton ($10^{10}$ Hz of stopped muons).

Figure 17:
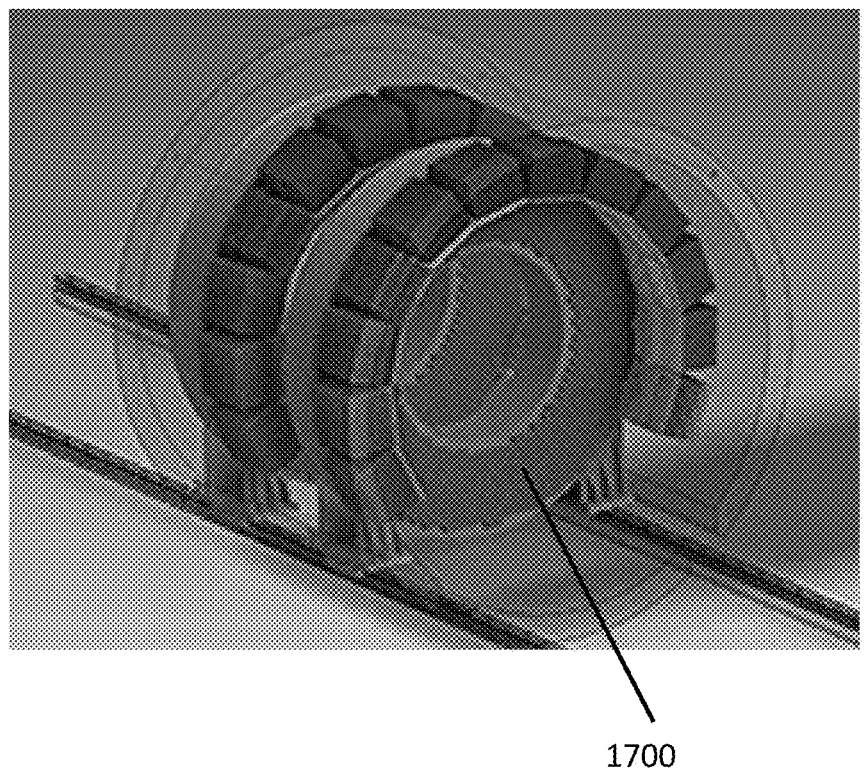
FIG. 17 is a close up of the calorimeter comprising scintillation crystals that can be used in the particle accelerator of FIG. 16.

FIG. 17 is a close up of the calorimeter 1616 comprising scintillation crystals 1700. The scintillation crystals can be coupled to the detector of FIG. 15. In the system of FIG. 16, the calorimeter must confirm that a reconstructed track of a ($\mu^- \rightarrow e^-$) conversion electron candidate is well measured, and was not created by a spurious combination of hits in the tracker. The position of the conversion electron should be measured with an uncertainty $\sigma(x)$ of less than or equal to 1 cm. The energy E deposited in the calorimeter must be compared to the reconstructed track momentum with an uncertainty in the energy scale small compared to the resolution (uncertainty $\sigma(E)$ of less than or equal to 2%). The time of the deposit in the calorimeter must be compared to the time determined from the tracker with an uncertainty $\sigma(t)$ of less than or equal to 1 nanosecond. The calorimeter must enable particle identification to separate, for example, electrons from muons, provide a trigger that can be used for event selection, and maintain functionality in a 50 Gy/year radiation environment with light yield loss of less than 10%. These requirements could be met by an array of ~2100 scintillation crystals (e.g., LYSO or $BaF_2$ crystals) coupled to the detector of FIG. 2.

In the above system, the detector of FIG. 15 can be used to detect muon to electron conversion ($\mu^- \rightarrow e^-$), or Kaon conversion according to $K^+ \rightarrow \pi^+ \nu \bar{\nu}$, $K^0_L \rightarrow \pi^0 \nu \bar{\nu}$, with process rates in the range $10^{-11}$-$10^{-18}$ and muon or kaon rates in the range $10^{10}$ to $10^{11}$ per second and with rejection of backgrounds. Further improvements could be achieved by shortening integration time or using faster scintillation crystals.

Imaging

In one embodiment, the scintillation can be in response to input EM radiation emitted from a biological cell due to a presence of a radionuclide in the biological cell. The scintillators can be positioned such that the semiconductor photodetector detects the scintillation. A computer can be provided for calculating a location of the radionuclide based on the scintillation.

One or more embodiments of the invention would directly benefit medical applications involving positron emission tomography (PET scans), which require faster scintillators to improve spatial resolution and sensitivity.

Figure 18:
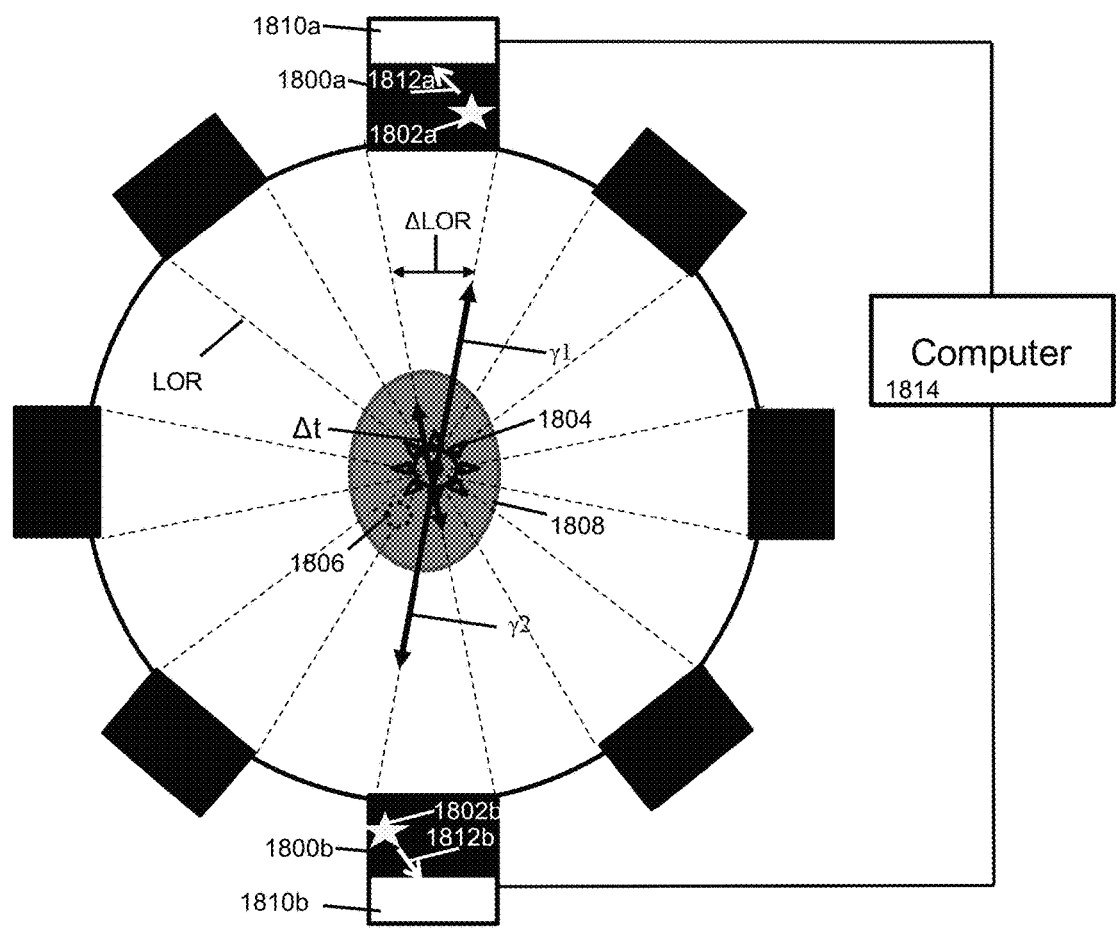
FIG. 18 illustrates a system for performing Positron Emission Tomography (PET) and that can include the detector of FIG. 18.

FIG. 18 illustrates a PET system comprising pairs of scintillators 1500 each comprising a first scintillator 1800a and a second scintillator 1800b. The first scintillator 1800a is positioned to receive a first gamma photon γ1 and emit a first scintillation 1802a in response thereto, and the second scintillator 1800b positioned to receive a second gamma photon γ2 and emit a second scintillation 1802b in response thereto. The first an second gamma photons γ1,γ2 are emitted as a pair from an electron-positron annihilation 1804, wherein the positron is emitted by a radionuclide tracer 1806 introduced into a biological cell in a patient 1808. The radionuclide tracer 1806 comprises a positron emitter such as $^{11}C$, $^{13}N$, $^{15}O$, $^{18}F$, or $^{82}Rb$, for example, that undergoes positron emission decay (beta decay), emitting the positron which travels a distance in the patient's 1808 tissue (e.g., less than 1 mm, but dependent on the isotope) before it annihilates 1804 with an electron, producing the pair of gamma photons γ1,γ2 each having 0.511 MeV energy and moving in approximately opposite directions (180 degrees to each other).

The scintillators 1800a-180b are positioned in a ring around the patient 1808.

The PET system further comprises the detectors 200 including one of the detectors 1810a positioned to detect the EM radiation 1812a comprising the first scintillation 1802a and one of the detectors 1810b positioned to detect the EM radiation 1812b comprising the second scintillation 1802b.

The PET system further comprises one or more computers 1814 for performing a (e.g., three dimensional) calculation of a location of the radionuclide tracer 1806. From the gamma photons detected by the scintillator, it is possible to localize their source along a straight line of response (LOR). The LOR can have a degree of uncertainty ΔLOR as the emitted photons may not be exactly 180 degrees apart and/or the scintillators have a aperture that can receive photons from different directions. Thus, the first and second scintillations 1802a, 1802b define a line of response LOR and the intersections of the lines of response LOR are used to determine the location of the radionuclide tracer 1806 (e.g. in two dimensions) with a first uncertainty ΔLOR.

If the resolving time of the detectors 1810a-b is reduced (e.g., less than 500 picoseconds) the annihilation event 1804 can be localized to a segment of a chord whose length is determined by the detector's time resolution. Thus, the relative detection times of the first scintillation 1802a and the second scintillation 1802b are used to determine the position of the radionuclide tracer 1806 in an additional dimension (e.g., $3^{rd}$ dimension) with a second uncertainty Δt determined by the temporal resolution of the detectors 1810a-b. The computer and detectors 1810a-b can measure the times of flight (TOF) of the gamma photons γ1,γ2, and if one of the detectors 1810a-b detects one of the photons γ1,γ2 arriving earlier, the radionuclide tracer 1806 is closer to that detector. The temporal resolution of the detectors 1810a-b allows the second uncertainty Δt to be comparable to the first uncertainty ΔLOR such that the computer 1814 has increased ability to reject erroneous lines of response due to background scintillation (the background scintillation including response to pairs of gamma photons that are not emitted by the electron-positron annihilation 1804).

Improved timing resolution can also improve the signal-to-noise ratio (SNR) of the image, requiring fewer events to achieve the same image quality. Using tomography, three-dimensional images of tracer concentration within the patient's body can be constructed from the detection on the detectors using computer analysis in a computer 1814.

Figures 19A, 19B:
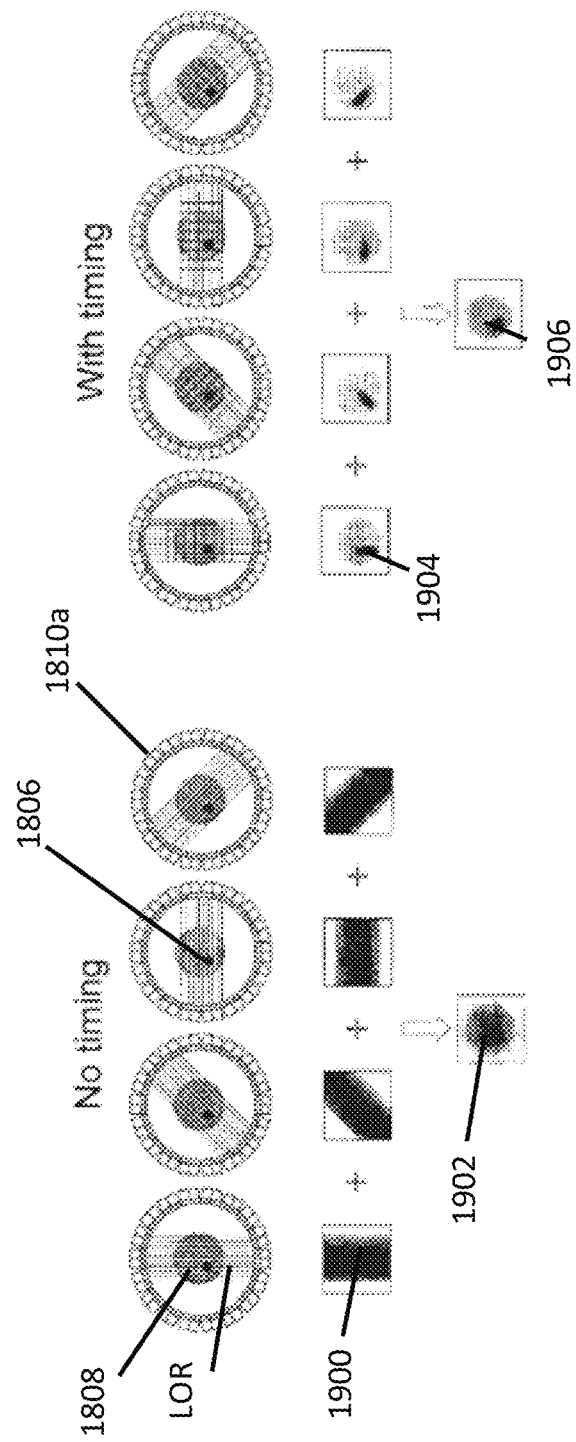
FIG. 19a-b illustrates how improved temporal resolution and/or higher quantum efficiency of the invention can be used to increase spatial resolution of the PET, reduce scan time of the PET, and reduce dosing of the radionuclide tracer to obtain a given spatial resolution, using the detector according to one or more embodiments of the invention.

FIG. 19 illustrates how the timing can be controlled to increase spatial resolution of the PET, reduce scan time of the PET, and reduce dosing of the radionuclide tracer to obtain a given spatial resolution. FIGS. 19*a-b* show how the computer 1814 can control and receive detection data from different pairs of detectors 1800*a-b* at different angular co-ordinates around the patient 1808, yielding a series of LORs. The intersection 1900 of the LORs produced for the detectors 1810*a* at the different angular co-ordinates defines a location 1902 of the radionuclide. In the data obtained in FIG. 19*a*, no timing is used. FIG. 19*b* shows that, if timing is used such that relative transit time of the gammas γ1,γ2 can be measured, the intersection 1904 of the LORs produced for the detectors 1810*a-b* at the different angular co-ordinates defines a much smaller uncertainty for the location 1906 of the radionuclide. Thus, time resolution provides an independent spatial measurement. A time resolution for the detectors 1810*a-b* of 50 ps yields a spatial resolution of ~8 mm.

The scintillators 1800*a-b* can comprise scintillation crystals such as LYSO, BGO, or $BaF_2$. Faster scintillators provide the advantage of reducing dose rates and improving resolution via transit time measurements.

Figure 20:
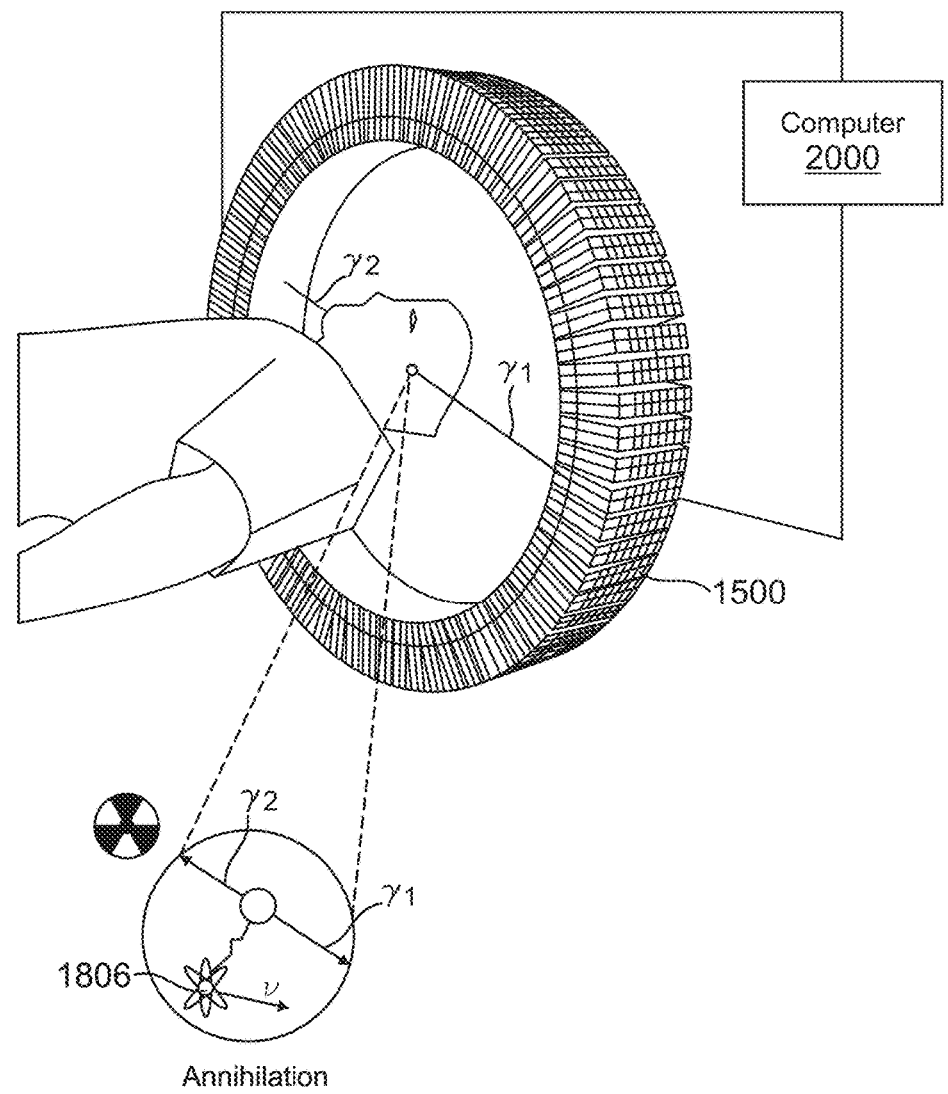
FIG. 20 illustrates a system for performing PET that can include the detector according to one or more embodiments of the invention.

FIG. 20 illustrates system for performing Positron Emission Tomography (PET) and comprising scintillators 1500 that can be coupled to detectors 200 (e.g., as illustrated in FIG. 15) according to one or more embodiments, wherein the detector 200 detects the scintillation emitted by the scintillator 1500 in response to EM radiation γ1, γ2, due to or emitted by a radionuclide tracer 1806 introduced into a biological cell; and a computer 200 for controlling timing at which the EM radiation γ1, γ2 is detected by the detector, wherein the timing is controlled to increase the spatial resolution of the PET, reduce scan time of the PET, and reduce dosing of the radionuclide tracer 1806.

Table 1 illustrates the time resolution (Δt) in picoseconds and time of flight (TOF) gain for various scintillator hardware that could be used in the detector of FIG. 15 in a PET application.

TABLE 1

| Hardware | Δt(ps) | TOF gain |
| --- | --- | --- |
| BGO Block Detector | 3000 | 0.8 |
| LSO Block (non-TOF) | 1400 | 1.7 |
| LSO Block (TOF) | 550 | 4.2 |
| $LaBr_3$ Block | 350 | 6.7 |
| LSO Single Crystal | 210 | 11.1 |
| $LuI_3$ Single Crystal | 125 | 18.7 |
| $LaBr_3$ Single Crystal | 70 | 33.3 |

Space and Defense Applications

Planetary and astronomical imaging and spectroscopy in the UV require improvements in detector capabilities. One or more embodiments of the invention can be used for cosmic ray detectors for astrophysics and cosmology.

NASA has flown a number of instruments and missions using scintillation detectors, including MESSENGER's Gamma ray and neutron spectrometer; the CGRO Energetic Gamma Ray Experiment Telescope (CGRO/EGRET); the Fermi Large Area Telescope (Fermi/LAT); and the Fermi Gamma-Ray Burst Monitor (Fermi/GBM). The unique capabilities of the proposed subnanosecond scintillation detector are an enabling technology for NASA's Advanced Compton Telescope and other missions requiring high efficiency gamma-ray detection with excellent time resolution, such as a follow-on to the Fermi-LAT.

Other Applications

The detectors 200, 400 according to one or more embodiments of the invention are not limited to applications or devices that detect scintillation from scintillators. In one or more embodiments, the detector 200, 400 can also be used to detect Electromagnetic (EM) radiation, e.g., with increased temporal response or resolution.

Other applications include using the detector according to one or more embodiments as a Deep Ultraviolet (DUV) detector for the semiconductor industry, spectrometers, narrowband ultraviolet (UV) imaging, UV spectroscopy for applications in remote sensing, communication, machine vision.

While many examples of applications are provided, these are merely provided as examples. Other applications are also possible.

Advantages and Improvements

Using molecular beam epitaxy (MBE) for superlattice passivation and atomic layer deposition for multilayer, solar-blind antireflection coatings, according to one or more embodiments of the invention, a unique detector capability for photon-counting detection of deep ultraviolet scintillation signals with integrated solar-blind antireflective coatings can be provided. In one example, these techniques can be applied to large area avalanche photodiodes, such as the Hamamatsu S8664-1010, to produce fast 1 $cm^2$ devices with high quantum efficiency in the required 220 nm wavelength regime, and strong rejection of background fluorescence in the near ultraviolet. For example, visible blind, MBE grown superlattice doped silicon APDs according to one or more embodiments can achieve >50% QE at a wavelength of 220 nm, low dark current, high conductivity, and be radiation tolerant. The ALD deposited visible blind can provide a chemically passivated surface and <1% QE at a wavelength of 330 nm.

An all-solid-state UV detector as disclosed in one or more embodiments of the invention will enable substantial improvements in mass, volume, complexity, power, and robustness compared with conventional photo-emissive based technologies. Although silicon detector systems have been demonstrated with high quantum efficiency in the UV, they are often not suitable for applications where visible or solar-blindness is required. The filter integration methods described here are one promising way to produce solid-state silicon detectors that can exceed the efficiency performance of current state of the art microchannel plate devices, while simultaneously offering high rejection of out-of-band light.

REFERENCES

The following references are incorporated by reference herein.

[1] Hamamatsu brochure for MPPC Modules, Selection guide—January 2014.
[2] U.S. Pat. No. 8,395,243 by Michael E. Hoenk. et. al.
[3] U.S. Pat. No. 8,680,637 by Michael E. Hoenk. et. al.
[4] M. E. Hoenk, S. Nikzad, A. G. Carver, T. J. Jones, J. Hennessy, A. D. Jewell, J. Sgro, S. Tsur, M. McClish, R. Farrell, "Superlattice-doped imaging detectors: progress and prospects," Proc. SPIE. 9154, High Energy, Optical, and Infrared Detectors for Astronomy VI, 915413. (Jul. 30, 2014) Montreal, Canada, Jun. 24, 2014

[5] U.S. Pat. No. 8,828,852 by Michael E. Hoenk.

[6] J. Hennessy, A. D. Jewell, M. E. Hoenk, and S. Nikzad, "Metal-Dielectric Filters for Solar-Blind Silicon Ultraviolet Detectors," Applied Optics 54(15), 2015.

[7] B. Bates and D. J. Bradley, "Interference filters for the far ultraviolet (1700 Å to 2400 Å)," Appl. Opt. 5, 971-975 (1966).

[8] P. W. Baumeister, V. R. Costich, and S. C. Pieper, "Bandpass Filters for the Ultraviolet," Appl. Opt. 4, 911-914 (1965).

[9] Z. Jaksic, M. Maksimovie and M. Sarajlic, "Silver-Silica Transparent Metal Structures as Bandpass Filters for the Ultraviolet Range," J. Opt. A: Pure Appl. Opt 7, 51-55 (2005).

[10] J. Beringer et al. (Particle Data Group), Phys. Rev. D 86, 345 (2012).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. One or more scintillation detectors useful for detecting energetic photons or particles, the detectors each comprising:
   one or more scintillators that emit light (scintillation) in response to interactions with energetic photons or particles, the scintillation having a first component with a decay time less than 100 nanoseconds and a second component having a decay time longer than 100 nanoseconds;
   one or more semiconductor photodetectors each comprising a passivation layer having a surface area for receiving the scintillation, wherein:
      the passivation layer comprises a layer of silicon that is doped with a sheet density of at least $10^{14}$ cm$^{-2}$ that at least partially passivates the surface area, and
      the one or more semiconductor photodetectors have built in gain through avalanche multiplication, such that charge generated in the one or more semiconductor photodetectors in response to the scintillation is amplified through impact ionization to produce an output pulse; and
   a bandpass filter integrated with each of the one or more semiconductor photodetectors, wherein:
      the bandpass filter comprises a metal-dielectric coating on the surface area,
      the bandpass filter transmits light within a range of wavelengths corresponding to the first component of the scintillation, and
      the bandpass filter suppresses transmission of light corresponding to the second component with wavelengths outside said range of wavelengths.

2. The one or more scintillation detectors of claim 1, wherein:
   the coating includes alternating dielectric and metal;
   the bandpass filter couples the first component of the scintillation into one of the semiconductor photodetectors, the first component:
      having a decay time faster than 1 nanosecond, and
      having a peak intensity with the wavelength in a range of 190-250 nanometers; and
   the one or more semiconductor photodetectors detect the first component of the scintillation.

3. The one or more scintillation detectors of claim 1, wherein the bandpass filter transmits the first component having a wavelength of 300 nanometers or less and the photodetectors detect the scintillation comprising ultraviolet scintillation.

4. The one or more scintillation detectors of claim 1, wherein the energetic particles or photons comprise gamma radiation.

5. The one or more scintillation detectors of claim 1, wherein:
   the coating includes alternating dielectric and metal.

6. The one or more scintillation detectors of claim 1, wherein:
   the coating includes one or more dielectric layers having one or more first thicknesses and one or more metal layers having one or more second thicknesses.

7. The one or more scintillation detectors of claim 1, wherein:
   the coating comprises transparent dielectric and reflective metal, and
   the bandpass filter comprises a Fabry-Perot cavity and/or a photonic bandgap.

8. The one or more scintillation detectors of claim 1, wherein the layer of silicon comprises at least one delta-doped layer.

9. The one or more scintillation detectors of claim 1, wherein the layer of silicon comprises at least two delta-doped layers.

10. The one or more scintillation detectors of claim 1, wherein the one or more scintillators comprise one or more doped or undoped Barium Fluoride (BaF$_2$) crystals.

11. The one or more scintillation detectors of claim 1, wherein the one or more scintillators emit the scintillation having the first component including a peak wavelength near 220 nanometers and a second component including a peak wavelength near 300 nanometers.

12. The one or more scintillation detectors of claim 1, wherein the one or more scintillators are chosen from at least one doped or undoped crystal selected from LaBr$_3$, CsI, CeF$_3$, PWO, LSO, and LYSO.

13. A system for performing Positron Emission Tomography (PET) and including the one or more scintillation detectors of claim 1, further comprising:
   pairs of the scintillators each comprising a first scintillator and a second scintillator, the first scintillator positioned to receive a first gamma photon and emit a first scintillation in response thereto, the second scintillator positioned to receive a second gamma photon and emit a second scintillation in response thereto, the first and the second gamma photons emitted as a pair from an electron-positron annihilation, and the positron from the electron-positron annihilation emitted by a radionuclide tracer introduced into a biological cell;
   one of the semiconductor photodetectors positioned to detect the scintillation comprising the first scintillation and one of the detectors positioned to detect the scintillation comprising the second scintillation;

one or more computers for performing a three-dimensional calculation of a location of the radionuclide tracer, wherein:
the first and the second scintillations define a line of response and the intersections of the lines of response are used to determine the position of the radionuclide tracer with a first uncertainty, and
the relative detection times of the first scintillation and the second scintillation are used to determine the position of the radionuclide tracer in an additional dimension with a second uncertainty determined by the temporal resolution of the detectors.

14. A high energy particle detecting system comprising the one or more scintillation detectors of claim 1, wherein the scintillation comprises ultraviolet electromagnetic radiation and/or gamma electromagnetic radiation.

15. The one or more scintillation detectors of claim 1, wherein the coating, grown on the semiconductor, comprises a metal layer between two dielectric layers, the dielectric layers comprising at least one material selected from $HfO_2$, $Al_2O_3$, $SiO_2$, $MgF_2$, and $AlF_3$.

16. A method of fabricating one or more scintillation detectors useful for detecting energetic photons or particles, the detectors each comprising:
providing one or more scintillators that emit light (scintillation) in response to interactions with energetic photons or particles, such that at least a first component of the scintillation has a decay time less than 100 nanoseconds;
obtaining one or more semiconductor photodetectors each comprising a passivation layer having a surface area for receiving the scintillation, wherein:
the passivation layer comprises a layer of silicon that is doped with a sheet density of at least $10^{14}$ cm$^{-2}$ that at least partially passivates the surface area, and
the one or more semiconductor photodetectors have built in gain through avalanche multiplication, such that charge generated in the one or more semiconductor photodetectors in response to the scintillation is amplified through impact ionization to produce an output pulse; and
integrating a bandpass filter with each of the one or more semiconductor photodetectors, comprising applying a metal-dielectric coating on the surface area, wherein:
the bandpass filter comprises the coating on the surface area, and
the bandpass filter transmits light within a range of wavelengths corresponding to the first component of the scintillation and suppresses transmission of light with wavelengths outside said range of wavelengths.

17. One or more scintillation detectors useful for detecting energetic photons or particles, the detectors each comprising:
one or more scintillators that emit light (scintillation) in response to interactions with energetic photons or particles, the scintillation having a first component with a decay time less than 100 nanoseconds and a second component having a decay time longer than 100 nanoseconds;
one or more silicon photodetectors each comprising a passivation layer having a surface area for receiving the scintillation, wherein
the passivation layer comprises a doped superlattice, and
the one or more silicon photodetectors have built in gain through avalanche multiplication, such that charge generated in the one or more silicon photodetectors in response to the scintillation is amplified through impact ionization to produce an output pulse; and
a bandpass filter integrated with each of the one or more silicon photodetectors, wherein:
the bandpass filter comprises a metal-dielectric coating on the surface area,
the bandpass filter transmits light within a range of wavelengths corresponding to the first component of the scintillation, and
the bandpass filter suppresses transmission of light corresponding to the second component with wavelength outside said range of wavelengths.

18. The one or more scintillation detectors of claim 17, wherein the silicon photodetectors are thinned.

* * * * *